(12) United States Patent
Watanabe et al.

(10) Patent No.: US 10,755,920 B2
(45) Date of Patent: Aug. 25, 2020

(54) METHOD FOR MANUFACTURING SEMICONDUCTOR DEVICE AND SEMICONDUCTOR MANUFACTURING APPARATUS USED FOR THE METHOD

(71) Applicants: OSAKA UNIVERSITY, Suita-shi, Osaka (JP); FUJI ELECTRIC CO., LTD., Kawasaki-shi, Kanagawa (JP)

(72) Inventors: Heiji Watanabe, Suita (JP); Takayoshi Shimura, Suita (JP); Takuji Hosoi, Suita (JP); Mitsuru Sometani, Tsukuba (JP)

(73) Assignees: FUJI ELECTRIC CO., LTD., Kawasaki (JP); OSAKA UNIVERSITY, Osaka (JP)

( * ) Notice: Subject to any disclaimer, the term of this patent is extended or adjusted under 35 U.S.C. 154(b) by 11 days.

(21) Appl. No.: 15/221,153

(22) Filed: Jul. 27, 2016

(65) Prior Publication Data
US 2017/0069487 A1    Mar. 9, 2017

(30) Foreign Application Priority Data

Sep. 7, 2015   (JP) ................................ 2015-175999
Mar. 2, 2016   (JP) ................................ 2016-040129

(51) Int. Cl.
*H01L 21/02*     (2006.01)
*C23C 8/80*      (2006.01)
(Continued)

(52) U.S. Cl.
CPC .......... *H01L 21/02271* (2013.01); *C23C 8/10* (2013.01); *C23C 8/80* (2013.01);
(Continued)

(58) Field of Classification Search
CPC ......... H01L 21/02271; H01L 21/02236; H01L 21/02255; H01L 21/049; H01L 21/02164;
(Continued)

(56) References Cited

U.S. PATENT DOCUMENTS 6,482,704 B1    11/2002  Amano et al.
6,610,366 B2 *   8/2003  Lipkin ................. H01L 21/049
                                                257/E21.063
(Continued)

FOREIGN PATENT DOCUMENTS

JP    55-128824 A    10/1980
JP    05-117865 A     5/1993
(Continued)

OTHER PUBLICATIONS

Definition of Fill—www.dictionary.com/browse/fill—accessed online Mar. 5, 2018.*
(Continued)

*Primary Examiner* — Michael P Wieczorek
*Assistant Examiner* — Michael G Miller

(57) ABSTRACT

A method for manufacturing a semiconductor device includes: thermally-oxidizing a surface of a to-be-processed base made by SiC as body material to form a silicon dioxide film, by supplying gas containing oxidation agent to the surface of the to-be-processed base; exchanging ambient gas containing the oxidation agent after forming the silicon dioxide film, by decreasing a partial pressure of the oxidation agent in the ambient gas to 10 Pa or less; and after exchanging the ambient gas, lowering a temperature of the to-be-processed base.

13 Claims, 24 Drawing Sheets

(51) Int. Cl.
  *C23C 8/10* (2006.01)
  *H01L 49/02* (2006.01)
  *H01L 29/66* (2006.01)
  *C23C 16/455* (2006.01)
  *C23C 16/458* (2006.01)
  *C23C 16/46* (2006.01)
  *C23C 16/52* (2006.01)
  *H01L 21/04* (2006.01)
  *H01L 29/16* (2006.01)

(52) U.S. Cl.
  CPC .......... *C23C 16/455* (2013.01); *C23C 16/458* (2013.01); *C23C 16/46* (2013.01); *C23C 16/52* (2013.01); *H01L 21/02164* (2013.01); *H01L 21/02236* (2013.01); *H01L 21/02255* (2013.01); *H01L 21/049* (2013.01); *H01L 28/00* (2013.01); *H01L 29/66068* (2013.01); *H01L 29/1608* (2013.01)

(58) Field of Classification Search
  CPC ......... H01L 29/1608; C23C 8/80; C23C 8/10; C23C 16/458; C23C 16/52; C23C 16/455; C23C 16/46
  USPC ............................................ 427/248.1–255.7
  See application file for complete search history.

(56) References Cited

U.S. PATENT DOCUMENTS

| | | | |
|---|---|---|---|
| 6,767,843 | B2 | 7/2004 | Lipkin et al. |
| 6,956,238 | B2 | 10/2005 | Ryu et al. |
| 7,067,176 | B2 | 6/2006 | Das et al. |
| 2008/0227256 | A1* | 9/2008 | Tanimoto ............ H01L 21/0485 438/285 |
| 2012/0263888 | A1* | 10/2012 | Matsuura ............. C23C 16/345 427/579 |

FOREIGN PATENT DOCUMENTS

| | | |
|---|---|---|
| JP | 05-129214 A | 5/1993 |
| JP | 2001-210637 A | 8/2001 |
| JP | 2003-31571 | 1/2003 |
| JP | 2004-511101 | 4/2004 |
| WO | WO 02/29874 A2 | 4/2002 |

OTHER PUBLICATIONS

Cheung (N. Cheung Lecture notes, U.C. Berkeley EE143 Fall 2010) (Year: 2010).*

Kenji Fukuda et al., "3.2 MOS Structure," in Kazuo Arai et al. (eds.), Base and Application of SiC Element, Japan: Ohmsha, Ltd., pp. 84-86 (2003).

Japanese Office Action dated Sep. 10, 2019 from Japanese Patent Application No. 2016-040129, 11 pages.

* cited by examiner

METHOD FOR MANUFACTURING SEMICONDUCTOR DEVICE AND SEMICONDUCTOR MANUFACTURING APPARATUS USED FOR THE METHOD

CROSS-REFERENCE TO RELATED APPLICATIONS

This application claims benefit of priority under 35 USC 119 based on Japanese Patent Applications No. 2015-175999 filed Sep. 7, 2015 and No. 2016-0040129 filed Mar. 2, 2016, the entire contents of which are incorporated by reference herein.

BACKGROUND

The present invention relates to methods for manufacturing semiconductor devices, the methods include processes of thermally-oxidizing surfaces of semiconductor substrates made by silicon carbide (SiC) as body material, or a semiconductor layer made by SiC as body material, configured to form a silicon dioxide film ($SiO_2$ film), and semiconductor manufacturing apparatus, which can be used for the methods.

As an earlier SiC semiconductor device, a MOSFET or a MOS capacitor for example has been known that uses a semiconductor substrate made by SiC as body material (hereinafter referred to as "SiC substrate"), or a semiconductor layer made by SiC as body material (hereinafter referred to as "SiC layer"). As a gate insulating film for MOSFET or an insulating film for MOS capacitor, an $SiO_2$ film has been used. The $SiO_2$ film has a high insulating characteristic due to the behavior that the $SiO_2$ film has a wide band gap and the $SiO_2$ film forms a large energy barrier height at the interface between the semiconductor and metallic film. Thus, various applications using the $SiO_2$ film have been expected in the SiC semiconductor device.

Methods of forming a $SiO_2$ film on a surface of an SiC substrate or an SiC layer include, for example, a thermal oxidation method using the exposure of a surface of the SiC substrate or the SiC layer, being heated to a high temperature, to oxidizing ambient, a chemical vapor deposition (CVD) method by introducing and pyrolyzing raw material gas such as the organic silane-based gas on the surface of the SiC substrate, or a physical vapor deposition (PVD) method such as a sputtering method. Among these methods of forming the $SiO_2$ film, the thermal oxidation method is advantageous from the viewpoint of the insulating characteristic such as leakage current or the interface level.

However, the formation of an $SiO_2$ film on the surface of an SiC substrate or an SiC layer based on the thermal oxidation method is reported that interface defects unique to the interface between $SiO_2$ and SiC are generated. These interface defects cause the interface between $SiO_2$ and SiC to have a very poor characteristic. Therefore, in the case of an SiC-MOSFET, which has a gate insulating film made by an $SiO_2$ film formed by the thermal oxidation method on the SiC substrate or the SiC layer, because the channel mobility is much lower than the speculated value based on the bulk mobility of the SiC, the practical use of thermal oxide film in a transistor is prevented. Thus, since the SiC-MOSFET has a very-low channel mobility, the on-state resistance value (Ron) is much higher than a value theoretically estimated based on the physical property value.

In the case of four-fold periodicity hexagonal silicon carbide (4H-SiC) in particular, regardless of the fact that the bulk electron mobility is about 900 $cm^2/Vs$, the MOSFET in which a gate oxidation film is formed by a general thermal oxidation method such as dry oxidation has a very-low channel mobility of about 0 to 5 $cm^2/Vs$. This is presumably caused by the high interface level density in the vicinity of the conduction band of the channel region.

General methods of improving the interface characteristic between $SiO_2$ and SiC include a known method according to which a surface of an SiC substrate or an SiC layer is oxidized in an atmosphere including oxygen ($O_2$) to subsequently supply gas containing dinitrogen monoxide ($N_2O$) or nitric oxide (NO) as POA (Post Oxidation Annealing) (see JP2004-511101A1). In this case, it is considered that the oxidization and nitridation simultaneously so that nitrogen can contribute to the termination of the dangling bond of the interface during the oxidation process, thus achieving an effectiveness of decreased interface level density.

Another method has been suggested to form a thermally-oxidation film on the surface of an SiC substrate or an SiC layer in $O_2$ or a water vapor atmosphere at a temperature from 1100 degrees C. to 1200 degrees C., and then decrease the temperature of furnace in inert gas to so as to minimize the interface level density (see JP2003-31571A1).

However, in the case of the method according to JP2004-511101A1, by which ambient gas containing $N_2O$ or NO is used, there is a concern that the nitrogen-derived charge trapping center is generated in an oxidation film and the oxidation film has a deteriorated long-term reliability, regarding the electric stress to the oxidation film, for example. In the case of the method according to JP2003-31571A1 to decrease the interface level density by lowering temperature in inert gas on the other hand, the effectiveness to decrease the interface level density is insufficient.

In view of the above problems, it is an objective of the present invention to provide a manufacturing method of a semiconductor device according to which the interface level density between $SiO_2$ and SiC can be decreased when the surface of an SiC substrate or an SiC layer is thermally-oxidized to form an $SiO_2$ film, and a semiconductor manufacturing apparatus, which can be used for the manufacturing method.

SUMMARY

An aspect of the present invention inheres in a method for manufacturing a semiconductor device, including: (a) thermally-oxidizing a surface of a to-be-processed base made by SiC as body material to form a silicon dioxide film, by supplying gas containing oxidation agent to the surface of the to-be-processed base; exchanging ambient gas containing the oxidation agent after forming the silicon dioxide film, by decreasing a partial pressure of the oxidation agent in the ambient gas to 10 Pa or less; and after the exchange of the ambient gas, lowering a temperature of the to-be-processed base.

Another aspect of the present invention inheres in a method for manufacturing a semiconductor device, including: (a) thermally-oxidizing a surface of a to-be-processed made by silicon carbide as body material base to form a silicon dioxide film by supplying gas containing oxidation agent to the surface of the to-be-processed base; and after the formation of the silicon dioxide film, lowering a temperature of the to-be-processed base to a temperature at which the oxidation of the surface of the to-be-processed base is stopped within 2 seconds from the completion of the formation of the silicon dioxide film.

Still another aspect of the present invention inheres in a semiconductor manufacturing apparatus, including: (a) a reaction tube configured to store a to-be-processed base made by SiC as body material; and a gas supply tube configured to supply gas containing oxidation agent into the reaction tube, wherein the gas is supplied to thermally-oxidize the surface of the to-be-processed base to form a silicon dioxide film and, after the formation of the silicon dioxide film, a partial pressure of the oxidation agent in the reaction tube is decreased to 10 Pa or less after which the interior of the reaction tube is caused to have a lowered temperature.

Still another aspect of the present invention inheres in a semiconductor manufacturing apparatus, including: (a) a reaction tube configured to store a to-be-processed base made by SiC as body material; and a gas supply tube configured to supply gas containing oxidation agent into a reaction tube, wherein the gas is supplied to thermally-oxidize the surface of the to-be-processed base to form a silicon dioxide film and, after the formation of the silicon dioxide film, the temperature of the to-be-processed base is lowered to a temperature at which the oxidation of the surface of the to-be-processed base is stopped within 2 seconds from the completion of the formation of the silicon dioxide film.

BRIEF DESCRIPTION OF DRAWINGS

FIG. 11C of the manufacturing method of the MOSFET according to the second modification of the first embodiment of the present invention;

FIG. 12C of the manufacturing method of the MOSFET according to the second modification of the first embodiment of the present invention;

FIG. 13C of the manufacturing method of the MOSFET according to the second modification of the first embodiment of the present invention;

FIG. 16D of the manufacturing method of the MOSFET according to the third modification of the first embodiment of the present invention;

FIG. 17B of the manufacturing method of the MOSFET according to the third modification of the first embodiment of the present invention;

DETAILED DESCRIPTION OF THE INVENTION

Figure 1:
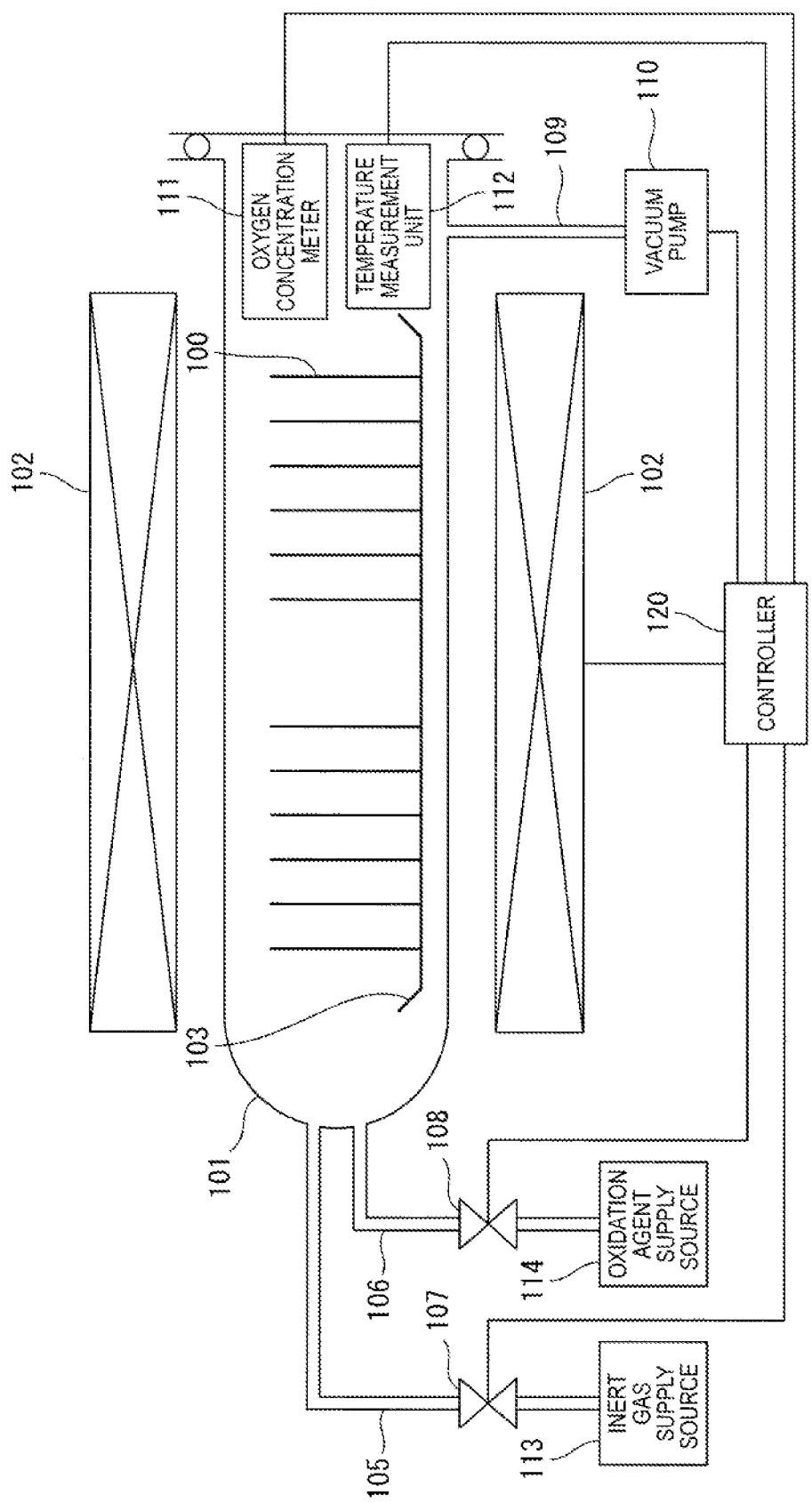
FIG. 1 is a schematic view illustrating an example of a semiconductor manufacturing apparatus (oxidation furnace) according to a first embodiment of the present invention.

With reference to the drawings, first and second embodiments of the present invention will be explained in detail below. In the following description of the drawings, the same or similar reference numerals are assigned to the same or similar portions. The drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions.

Moreover, the first and second embodiments shown below exemplifies a semiconductor manufacturing apparatus and a semiconductor device for embodying the technical ideas of the present invention. The technical ideas of the present invention do not specify the materials of the constituent components and the shape, structure, and arrangement thereof to those described below. The technical idea of the present invention can be variously changed without departing from the technical scope prescribed by the claims.

Furthermore, the conductivity type of the semiconductor device described in this specification is one example and is not required to be limited to the selection of the conductivity type used in the following description. In the specification and accompanying drawings, the majority carriers are electrons or holes in "n" and "p" labeled layer or regions, respectively. Superscript + and − attached to "n" or "p" mean that the impurity concentration is relatively high compared to that of a semiconductor region not attached with + and −. When "n" or "p" have similar notation including + and −, the notation means a similar concentration but the concentration is not always the same. In the specification, a Miller index represented with "−" means a bar followed by the index and "−" labeled in front of the index means that the index is a negative index.

In the specification, definitions of "upper" and "lower" of an "upper side", a "lower side", and the like are just a matter of expression on an illustrated cross-sectional view. For example, when the orientation of the semiconductor device is changed by 90 degrees, the references "upper" and "lower" shall correspond to left and right, and when the orientation of the semiconductor device is changed by 180 degrees, the relationship between the "upper" and "lower" shall be reversed.

<Semiconductor Manufacture Device>

As illustrated in FIG. 1, a semiconductor manufacturing apparatus according to a first embodiment of the present invention is an oxidation furnace including a reaction tube 101 made by substantially-cylindrical quartz for storing a to-be-processed base 100 made by SiC, a heating unit 102 provided at the periphery of the reaction tube 101, and a susceptor 103 that is placed in the reaction tube 101 and that is retainable a plurality of the to-be-processed bases 100. The to-be-processed base 100 made by SiC has a single layer structure of an SiC substrate or a multi-layer structure in which the uppermost surface has an SiC layer. The susceptor 103 is preferably made by material including SiC. The heating unit 102 may be an infrared lamp for example.

The upstream side of the reaction tube 101 is connected to one ends of a plurality of gas supply tubes 105 and 106, respectively. The other end of the gas supply tube 105 is connected to an inert gas supply source 113. The other end of the gas supply tube 106 is connected to an oxidation agent supply source 114. In the middle of the path of the gas supply tubes 105 and 106, gas valves 107 and 108 are provided that can adjust a gas flow rate. The inert gas supply source 113 supplies inert gas such as argon (Ar), helium (He), nitrogen ($N_2$), or the mixed gas of these gases to the reaction tube 101 via the gas supply tube 105. The oxidation agent supply source 114 supplies ambient gas containing oxidation agent (oxidation gas) such as $O_2$, water vapor, NO, $N_2O$, or the mixed gas of these gases to the reaction tube 101 via the gas supply tube 106. In a POA process, which will be described later, the oxidation agent supply source 114 supplies ambient gas such as $O_2$, water vapor, NO, $NO_2$, ammonia ($NH_3$) gas, or the mixed gas of these gases to the reaction tube 101 via the gas supply tube 106.

The downstream of the reaction tube 101 is connected to a vacuum pump 110 via an evacuation pipe 109. The vacuum pump 110 may be a turbomolecular pump, a cryopump, or a rotary pump for example. The interior of the reaction tube 101 includes a temperature measurement unit 112 that measures the temperatures of the interior of the reaction tube 101 and the to-be-processed base 100. The temperature measurement unit 112 may be a B-type thermocouple (rhodium 30% platinum rhodium alloy-rhodium 6% platinum rhodium alloy) for example. The interior of the reaction tube 101 includes an oxidation agent concentration meter 111 that can measure the partial pressure of the concentration of the oxidation agent in the gas in the reaction tube 101.

The temperature measurement unit 112, the oxidation agent concentration meter 111, the heating unit 102, the gas valves 107 and 108, and the vacuum pump 110 are electrically connected to a controller 120. The controller 120 controls the heating temperature of the heating unit 102, the inert gas flow rate, the oxidation agent flow rate, or the exhaust amount of the vacuum pump 110 for example based on the temperatures of the interior of the reaction tube 101 and the to-be-processed base 100 measured by the temperature measurement unit 112 and the oxidation agent concentration measured by the oxidation agent concentration meter 111. The controller 120 is implemented by a microprocessor or a memory for example having the function of a central processing unit (CPU).

<Method of Forming Oxidation Film>

Next, with reference to FIG. 1 to FIG. 3, an example of an oxidation film formation process using the semiconductor manufacturing apparatus according to the first embodiment of the present invention illustrated in FIG. 1 will be explained. The oxidation film formation process includes, as illustrated in the flowchart of FIG. 2, an elevated temperature process of step S10, an oxidation process of step S11, an atmosphere substitution process of step S12, and a lower temperature process of step S13.

As illustrated in FIG. 1, the to-be-processed base 100 made by SiC as body material is fixed in advance to the susceptor 103 in the reaction tube 101. This example is the batch-type one in which a plurality of the to-be-processed bases 100 are provided to the susceptor 103. However, the susceptor 103 may be the sheet type one in which one to-be-processed base 100 is placed. In the case of the sheet type one, the reaction tube 101 can have a smaller capacity and the atmosphere substitution can be carried out more efficiently.

Figure 2:
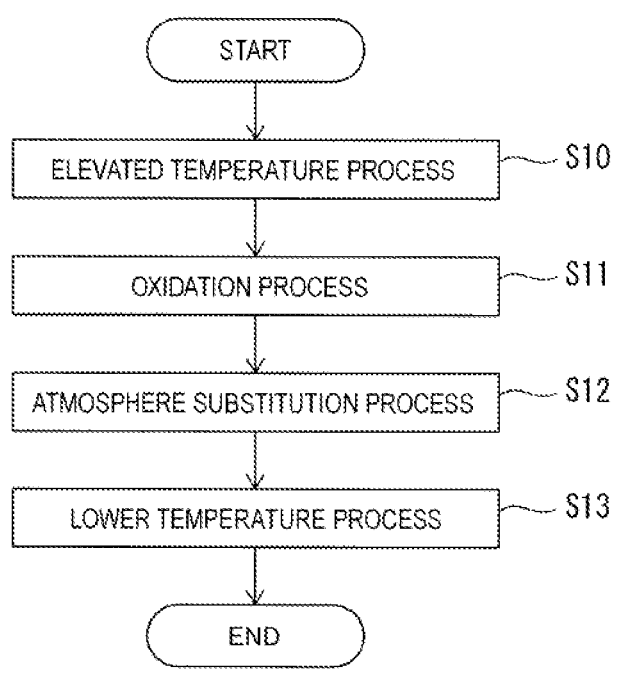
FIG. 2 is a flowchart illustrating an oxidation film formation process according to the first embodiment of the present invention.
Figure 3A:
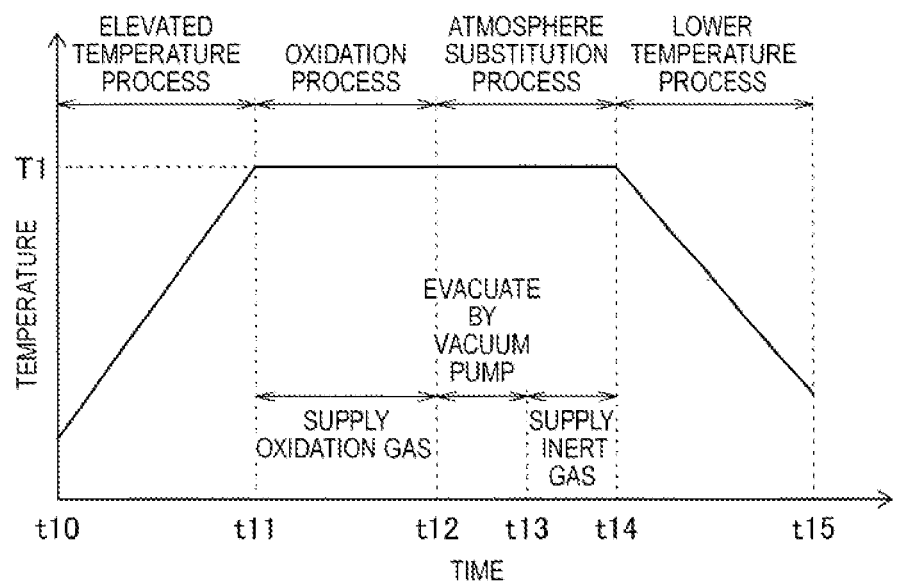
FIG. 3A to FIG. 3C are timing charts illustrating a temperature change of the oxidation film formation process according to the first embodiment of the present invention, respectively.

First, the elevated temperature process of step S10 of FIG. 2 is performed. As illustrated in FIG. 3A, in the elevated temperature process, at times t10 to t11, the heating unit 102 is used to heat the to-be-processed base 100 to rise the temperature of the interior of the reaction tube 101 and the to-be-processed base 100 until a predetermined temperature T1 at which SiC can be thermally-oxidized is reached.

Next, the oxidation process of step S11 of FIG. 2 is performed. In the oxidation process, as illustrated in FIG. 3A, the heating unit 102 is used to continue the heating at times t11 to t12. The temperature T1 of the to-be-processed base 100 measured by the temperature measurement unit 112 is retained within a temperature range from about 1250 degrees C. or more to about 1600 degrees C. or less within which SiC can be thermally-oxidized. The oxidation agent supply source 114 supplies ambient gas containing oxidation agent such as $O_2$, water vapor, NO, $N_2O$, or the mixed gas of these gases into the reaction tube 101 to provide a dry oxygen atmosphere to the interior of the reaction tube 101. This consequently allows the surface of the to-be-processed base 100 to be thermally-oxidized in the dry oxygen atmosphere having an atmosphere pressure to form an $SiO_2$ film having a thickness of about 30 nm for example.

Next, the atmosphere substitution process of step S12 of FIG. 2 is performed. In the atmosphere substitution process, as illustrated in FIG. 3A, at the times t12 to t13, the vacuum pump 110 is used at the temperature T1 of 1250 degrees C. or more for example to evacuate the interior of the reaction tube 101 to thereby remove the ambient gas containing oxidation agent remaining in the reaction tube 101. This consequently allows the partial pressure of the oxidation agent measured by the oxidation agent concentration meter 111 to be decreased to 10 Pa or less.

Next, at the times t13 to t14, the inert gas supply source 113 is allowed at the temperature T1 of 1250 degrees C. or more to supply inert gas such as Ar, He, $N_2$, or the mixed gas of these gases into the reaction tube 101 to thereby increase the pressure in the reaction tube 101 to the atmosphere pressure, thereby substituting the interior of the reaction tube 101 with an inert gas atmosphere. Note that the atmosphere substitution process may be performed at the same temperature as that of the oxidation process or may be performed at a temperature different from that of the oxidation process (a temperature higher or lower than that of the oxidation process).

Next, the lower temperature process of step S13 of FIG. 2 is performed. In the lower temperature process, as illustrated in FIG. 3A, at the times t14 to t15, the heating by the heating unit 102 is stopped to cool the interior of the reaction tube 101 and the to-be-processed base 100 in the Ar atmosphere until 800 degrees C. or less is reached, thereby a temperature is lowered. Thereafter, the to-be-processed base 100 on which an $SiO_2$ film is formed is taken out from the reaction tube 101, thereby completing the oxidation film formation process.

Figure 3B:
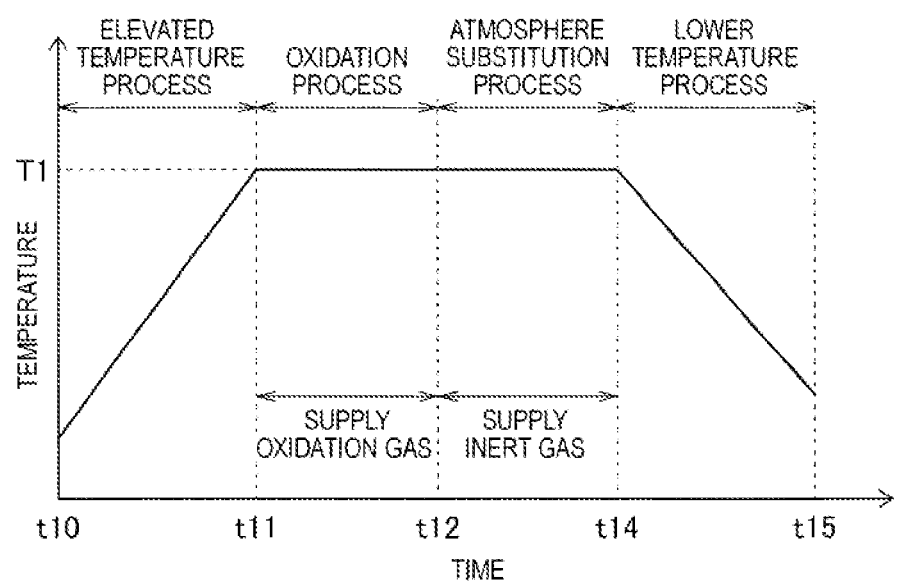

Note that in the atmosphere substitution process of step S12, the evacuation using the vacuum pump 110 as illustrated in FIG. 3A may be substituted with the introduction at the times t12 to t14 as illustrated in FIG. 3B of inert gas such as Ar into the reaction tube 101 to dilute the oxidation agent remaining in the reaction tube 101 to thereby decrease the partial pressure of the oxidation agent in the reaction tube 101 to 10 Pa or less and to substitute the atmosphere.

Figure 3C:
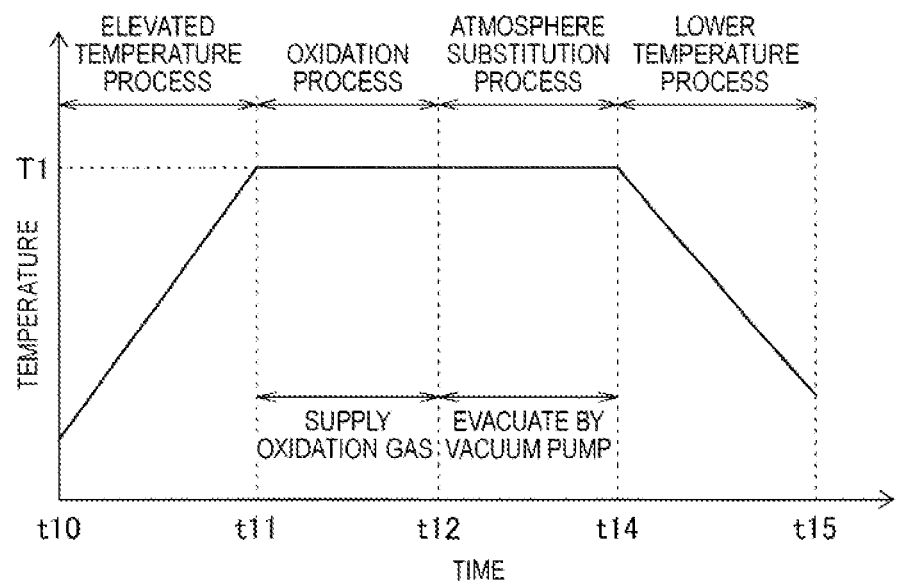

In the atmosphere substitution process of step S12, as illustrated in FIG. 3C, only the evacuation using the vacuum pump 110 may be performed at the times t12 to t14 to decrease the partial pressure of the oxidation agent measured by the oxidation agent concentration meter 111 to 10 Pa or less and no subsequent processing is required to introduce inert gas as illustrated in FIG. 3A. Note that the cooling effectiveness by the inert gas is lost, which increase the time required for the subsequent lower temperature process.

<Manufacture Method of Semiconductor Device>

Figure 4:
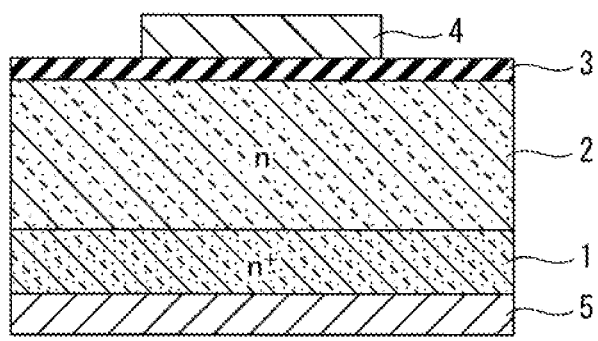
FIG. 4 is a cross-sectional view illustrating a structure of an MOS capacitor according to the first embodiment of the present invention.

Next, a case where the MOS capacitor illustrated in FIG. 4 is manufactured as one example of a manufacturing method of an SiC semiconductor device according to the first embodiment of the present invention will be explained. The MOS capacitor illustrated in FIG. 4 includes an $n^+$-type SiC substrate 1, an n-type SiC layer 2 placed on the SiC substrate 1, a capacitor insulating film ($SiO_2$ film) 3 placed on the SiC layer 2, an electrode 4 placed on the capacitor insulating film 3, and an electrode 5 placed on the bottom surface of the SiC substrate 1. The SiC substrate 1 and the SiC layer 2 constitute the to-be-processed base (1, 2) according to the first embodiment of the present invention. The SiC layer 2, the capacitor insulating film ($SiO_2$ film) 3, and the electrode 4 constitute a capacitor.

Next, with reference to FIG. 5A to FIG. 5D, an example of the manufacturing method of the MOS capacitor illustrated in FIG. 4 including the oxidation film formation process according to the first embodiment of the present invention will be explained.

Figure 5A:
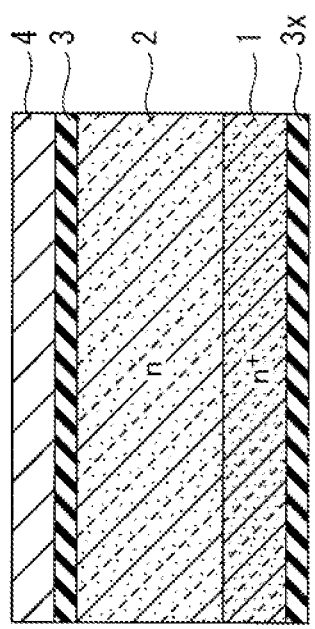
FIG. 5A to FIG. 5D are cross-sectional process views of a manufacturing method of the MOS capacitor according to the first embodiment of the present invention.

First, the $n^+$-type SiC substrate 1 having an impurity concentration of about $7 \times 10^{17}$ to $5 \times 10^{13}$ cm$^{-3}$ is prepared. The SiC substrate 1 may be a 4H-SiC (0001) substrate (a substrate 0 to 8 degrees off from the (0001) plane) for example. As illustrated in FIG. 5A, the n-type SiC layer (epitaxial layer) 2 having an impurity concentration of about $5 \times 10^{16}$ cm$^{-3}$ of about 5 µm is allowed to grow on the SiC substrate 1, thereby preparing the to-be-processed base (1, 2) having the SiC substrate 1 and the SiC layer 2. The to-be-processed base (1, 2) according to the first embodiment of the present invention preferably has a flat surface defining a specific plain orientation surface. The to-be-processed base (1, 2) after the epitaxial growth also has a flat surface 0 to 8 degrees off from the (0001) plane as a specific plain orientation surface.

Figure 5B:
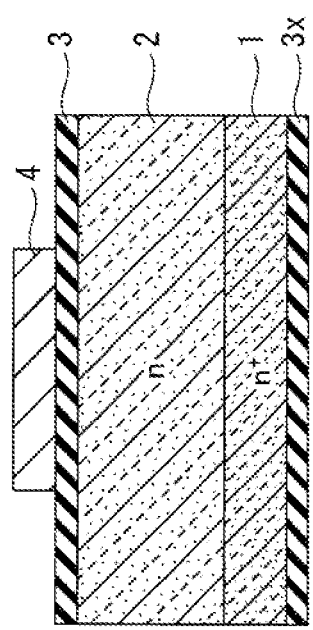

Next, after the to-be-processed base (1, 2) is washed, the to-be-processed base (1, 2) is stored in the oxidation furnace illustrated in FIG. 1 to perform the above-described oxidation film formation process according to the first embodiment of the present invention. As a result, as illustrated in FIG. 5B, the capacitor insulating film 3 made by an $SiO_2$ film having a thickness of about 30 nm is formed on the entirely top surface of the SiC layer 2 and an $SiO_2$ film 3*x* is also formed on the entirely bottom surface of the SiC substrate 1.

Figure 5C:
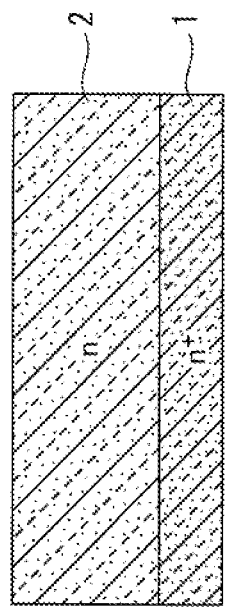

Next, an evaporation method at a room temperature or a sputtering method for example is used to deposit, as illustrated in FIG. 5C, a metallic film 4 such as aluminium (Al) on the entirely top surface of the capacitor insulating film 3.

Figure 5D:
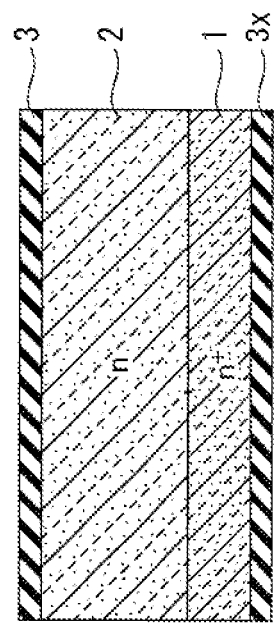

Thereafter, a photoresist film is coated on the metallic film 4 and a photolithography technique is used to pattern a photoresist film. The delineated photoresist film is used as a mask and a the dry etching for example is used to selectively remove a part of the metallic film 4, thereby forming the dot-like electrode 4 as illustrated in FIG. 5D.

Next, grinding or wet etching for example is used to remove the $SiO_2$ film 3*x* of the bottom surface of the SiC substrate 1. Thereafter, the evaporation method or the sputtering method for example is used to form, as illustrated in FIG. 4, the electrode 5 made by Al for example on the entirely bottom surface the SiC substrate 1 to thereby complete an MOS capacitor.

According to the first embodiment of the present invention, when the capacitor insulating film 3 made by the $SiO_2$ film of the MOS capacitor is formed, the partial pressure of the oxidation agent in the reaction tube 101 is decreased in the atmosphere substitution process until 10 Pa or less is reached, thereby allowing the partial pressure of the oxidation agent at the start of the lower temperature process to reach 10 Pa or less. This can consequently decrease the interface level density between SiC and $SiO_2$. Thus, a high-quality oxidation film 3 can be formed on the SiC layer 2.

<First Example>

As the first Example, the MOS capacitor illustrated in FIG. 4 was prepared. In the process of forming a capacitor insulating film of an MOS capacitor, the oxidation film formation process illustrated in FIG. 2 and FIG. 3A was performed. In the oxidation process of step S11, the to-be-processed base (1, 2) implemented by the SiC substrate 1 and the SiC layer 2 similar to that of FIG. 5A is oxidized at 1400 degrees C. in the dry oxygen atmosphere having an atmosphere pressure to form the capacitor oxidation film 3 having a thickness of 30 nm on the surface of the SiC layer 2. In the atmosphere substitution process of step S12, the vacuum pump 110 is used at 1400 degrees C. to remove the oxidation agent in the reaction tube 101 to allow the partial pressure of the oxidation agent (oxygen) to have 10 Pa or less. Thereafter, Ar is introduced into the reaction tube 101 and the pressure in the reaction tube 101 is set to the atmosphere pressure. In the lower temperature process of step S13, the to-be-processed base (1, 2) on which the capacitor oxidation film 3 is formed is temperature-lowered in the Ar atmosphere until 800 degrees C. or less is reached after which the to-be-processed base (1, 2) on which the capacitor oxidation film 3 was formed is taken out from the reaction tube 101.

As a Comparative Example A compared with the first Example, the Comparative Example A is different from the first Example in that the atmosphere substitution process is not performed after the oxidation process and instead the lower temperature process is started immediately in the atmosphere pressure oxygen atmosphere. A method similar in the other points is used to prepare an MOS capacitor. As a Comparative Example B, the Comparative Example B is different in that the vacuum pump 110 is used in the atmosphere substitution process to decrease the partial pressure of the oxidation agent to 100 Pa after which the lower temperature process is started to introduce Ar (i.e., the oxidation agent is caused to have a different partial pressure). A method similar in the other same points is used to prepare an MOS capacitor.

Figure 6:
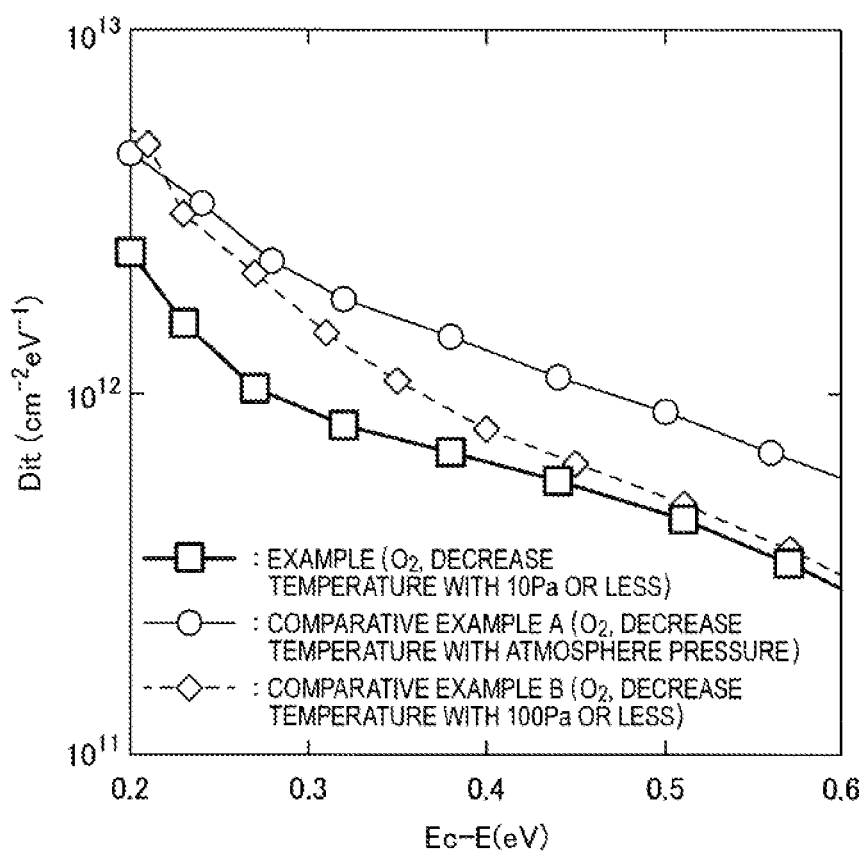
FIG. 6 is a graph illustrating the comparison of measurement values of the interface level densities of the first Example through Comparative Examples A and B.

The MOS capacitors according to the first Example and the Comparative Examples A and B is measured by a C-V meter to investigate the difference in the interface level density $D_{it}$ based on the High-Low technique using a 1 MHz C-V characteristic and a quasi-static C-V characteristic. FIG. 6 illustrates the interface level densities $D_{it}$ obtained from the measurement result of the MOS capacitor according to the first Example together with the Comparative Examples A and B. In FIG. 6, the horizontal axis represents the interface level energy in the bandgap (Ec represents a conduction band energy end) while the vertical axis represents the interface level density $D_{it}$.

As illustrated in FIG. 6, when the Comparative Example A is compared with the Comparative Example B with regard to the atmosphere during the lower temperature process, the Comparative Example B shows a higher effectiveness than the Comparative Example A to decrease the interface level density $D_{it}$ having a deep energy (or high Ec-E) but the Comparative Example B shows a lower effectiveness to decrease the interface level density $D_{it}$ having a shallow energy. On the other hand, the first Example shows an effectiveness to decrease the interface level density $D_{it}$ both in the case of the interface level having a deep energy and the interface level having a shallow energy.

As described above, according to the first Example, by decreasing the partial pressure of the oxidation agent in the reaction tube 101 during the lower temperature process to 10 Pa or less, the carbon-derived defect plane density segregating at the interface between SiC and $SiO_2$ could be decreased to $2 \times 10^{12}$ $cm^{-2}$ or less, thereby decreasing the interface level density $D_{it}$.

<Second Example>

Next, as the second Example, a plurality of MOS capacitors as in the first Example are prepared at a different temperature in the oxidation process. In the oxidation process, the oxidization is performed in the dry oxygen atmosphere having an atmosphere pressure at 1150 degrees C., 1200 degrees C., 1250 degrees C., 1300 degrees C., 1450 degrees C., and 1600 degrees C. to form capacitor oxidation films having a thickness of 30 nm on an SiC layer. The respective MOS capacitors are assumed as the second Examples A to F.

Figure 7:
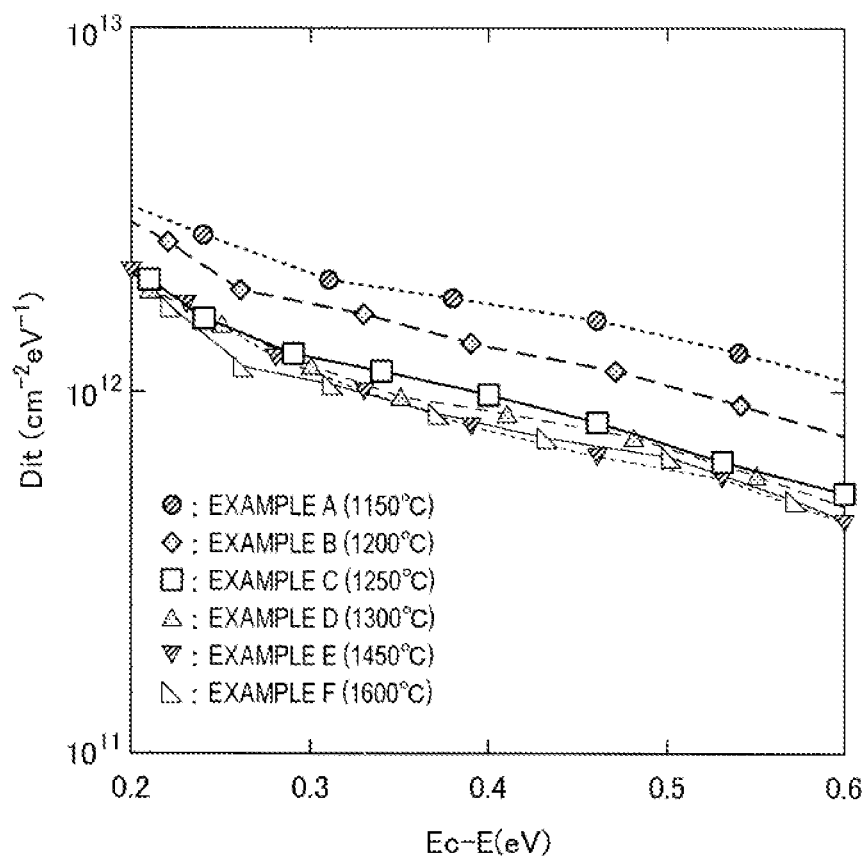
FIG. 7 is a graph illustrating the measurement values of the interface level densities of the second Examples A to F.

The MOS capacitors according to the second Examples A to F is measured by the C-V meter to investigate the difference in the interface level density $D_{it}$ based on the Hi-Low technique using the 1 MHz C-V characteristic and the quasi-static C-V characteristic. FIG. 7 illustrates the interface level density $D_{it}$ obtained from the measurement results of the second Examples A to F. As illustrated in FIG. 7, the Examples A, B, and C having the oxidation temperature of 1250 degrees C. or less show the decrease of the interface level density $D_{it}$ in accordance with the rising of the oxidation temperature. On the other hand, the Examples D, E, and F having the oxidation temperature of 1300 degrees C. or more show no significant difference in the interface level density.

The second Example shows that the oxidation process performed at 1250 degrees C. or less provides the increase of the interface level density $D_{it}$. Thus, when the oxidation process is performed at 1250 degrees C. or less, it is particularly effective that the lower temperature process is performed with the partial pressure of the oxidation agent of 10 Pa or less to thereby decrease the interface level density $D_{it}$.

<First Modification>

Figure 8:
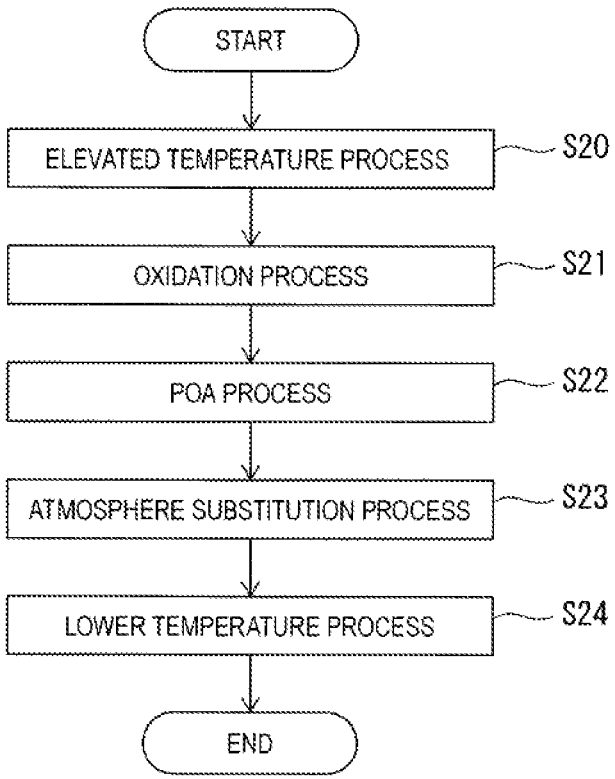
FIG. 8 is a flowchart illustrating an oxidation film formation process according to a first modification of the first embodiment of the present invention.

A modified example of the oxidation film formation process as a first modification of the first embodiment of the present invention will be explained. The oxidation film formation process according to the first modification of the first embodiment of the present invention includes, as illustrated in FIG. 8, the elevated temperature process of step S20, the oxidation process of step S21, the POA process of step S22, the atmosphere substitution process of step S23, and the lower temperature process of step S24. Specifically, the first modification is different from the procedure of the oxidation film formation process according to the first embodiment of the present invention illustrated in FIG. 2 in that the POA process of step S22 is added between the oxidation process of step S21 and the atmosphere substitution process of step S23.

Figure 9A:
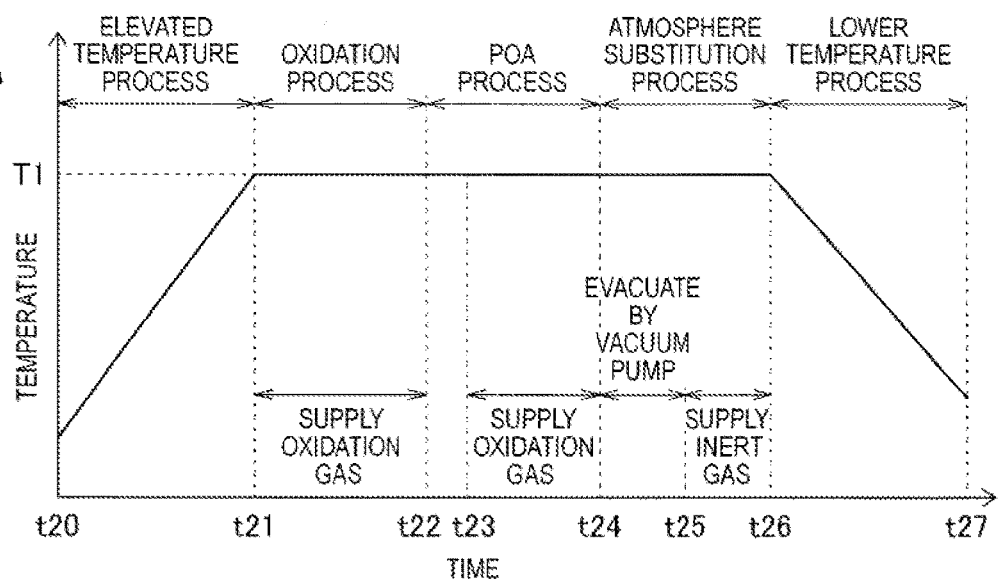
FIG. 9A to FIG. 9C are timing charts illustrating the temperature changes of the oxidation film formation process according to the first modification of the first embodiment of the present invention, respectively.

The elevated temperature process is performed in step S20 of FIG. 8. In the elevated temperature process, as illustrated in FIG. 9A, at the times t20 to t21, the temperature is rised to the predetermined temperature T1 by the heating with the heating unit 102. Next, in step S21 of FIG. 8, the oxidation process is performed. In the oxidation process, as illustrated in FIG. 9A, at the times t21 to t22, as in the oxidation process of step S11, the surface of the to-be-processed base 100 is thermally-oxidized by supplying gas containing oxidation agent while heating the surface to have the predetermined temperature T1 (about 1250 degrees C. to about 1600 degrees C.), thereby forming an $SiO_2$ film.

Next, the POA process is performed in step S22 of FIG. 8. A lowering temperature in the oxygen atmosphere prior to the POA process causes a poor interface characteristic. Thus, as illustrated in FIG. 9A, the POA process is performed at the same temperature T1 without causing lowering the temperature from the oxidation process. At the times t23 to t24, a heat treatment (annealing) is performed while allowing the oxidation agent supply source 114 to supply ambient gas containing $O_2$, water vapor, NO, $NO_2$, $NH_3$, or the mixed gas of these gases for example into the reaction tube 101.

The supply of the ambient gas containing $O_2$, water vapor, NO, $NO_2$, $NH_3$, or the mixed gas of these gases for example into the reaction tube 101 also may be started immediately after the times t22 without having an interval between times t22 to t23. Specifically, at the times t22 to t24, the heat treatment (annealing) also may be performed while supplying the ambient gas into the reaction tube 101. When the oxidation process of step S21 is shifted to the POA process of step S22 from the times t22 to t23 and when the temperature is lowered to a temperature lower than the temperature of the oxidation process (e.g., about 1000 degrees C. to about 1100 degrees C.), the atmosphere substitution process is preferably further added also prior to lowering the temperature.

Next, the atmosphere substitution process of step S23 of FIG. 8 is performed. In the atmosphere substitution process, as illustrated in FIG. 9A, at the times t24 to t25, the vacuum pump 110 is used at the predetermined temperature T1 to evacuate the interior of the reaction tube 101 to thereby remove the ambient gas used in the POA process remaining in the reaction tube 101, thereby decreasing the partial pressure of the oxidation agent the reaction tube 101 to 10 Pa or less.

Next, at the times t25 to t26, the inert gas is introduced from the inert gas supply source 113 into the reaction tube 101 to provide the substitution with an inert gas atmosphere. The atmosphere substitution process may have the same temperature as that of the POA process or may have a different temperature from that of the oxidation process (a temperature higher or lower than that of the oxidation process).

Next, in step S24 of FIG. 8, the lower temperature process is performed. In the lower temperature process, as illustrated in FIG. 9A, at the times t26 to t27, the heating unit 102 is stopped to lower the temperature to a predetermined temperature (e.g., 800 degrees C.) or less in the inert gas atmosphere.

According to the first modification, even when the POA process is performed after the oxidation process, in the atmosphere substitution process after the POA process, the partial pressure of the oxidation agent in the reaction tube 101 can be decreased to 10 Pa or less to allow the partial pressure of the oxidation agent at the start of the lower temperature process to have 10 Pa or less, thereby decreasing the interface level density between SiC and $SiO_2$. Thus, the high-quality $SiO_2$ film can be formed on the surface of the to-be-processed base 100.

Figure 9B:
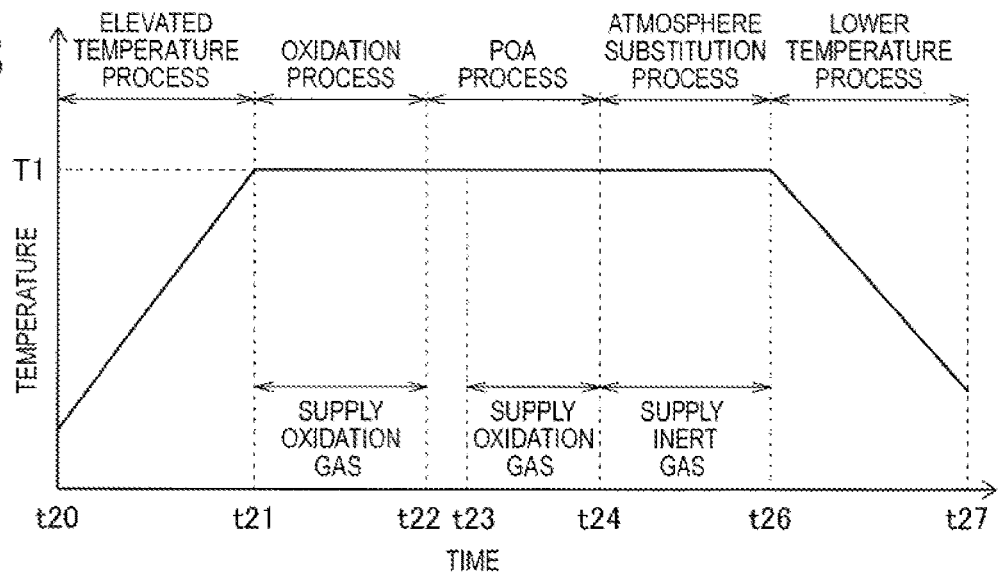

Note that, in the atmosphere substitution process of step S23 of FIG. 8, without performing the evacuation using the vacuum pump 110 as illustrated in FIG. 9A, the inert gas such as Ar may be introduced into the reaction tube 101 at the times t24 to t26 as illustrated in FIG. 9B to dilute the oxidation agent to decrease the partial pressure of the oxidation agent in the reaction tube 101 to 10 Pa or less, thereby substituting the atmosphere.

Figure 9C:
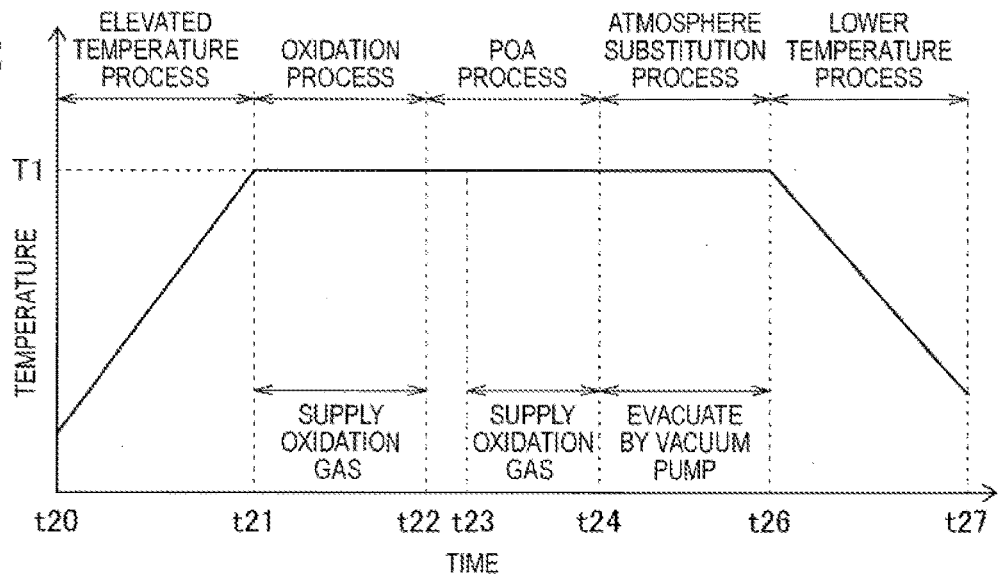

In the atmosphere substitution process of step S23 of FIG. 8, as illustrated in FIG. 9C, the evacuation using the vacuum pump 110 may be performed at the times t24 to t26 to perform only a processing to decrease the partial pressure of the oxidation agent measured by the oxidation agent concentration meter 111, thus eliminating the need for the subsequent introduction of inert gas as illustrated in FIG. 9A. Note that, since the cooling effectiveness by the inert gas is lost, the time required for the subsequent lower temperature process is longer.

<Second Modification>

Figure 10:
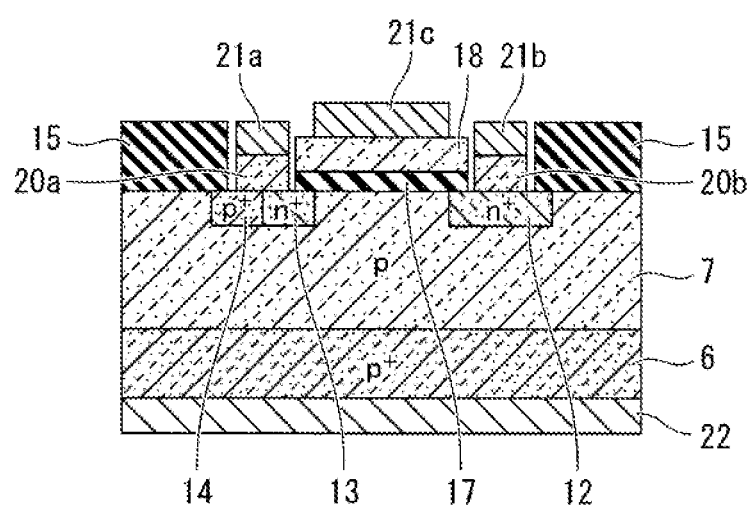
FIG. 10 is a cross-sectional view illustrating an example of a structure of an MOSFET according to a second modification of the embodiment of the present invention.

A method of manufacturing the horizontal MOSFET illustrated in FIG. 10 as a manufacturing method of a semiconductor device according to a second modification of the first embodiment of the present invention will be explained. As illustrated in FIG. 10, the semiconductor device according to the second modification of the first embodiment of the present invention includes a $p^+$-type SiC substrate 6 and a p-type epitaxial layer 7 placed on the SiC substrate 6. On the upper part of the epitaxial layer 7, a drain region 12, a source region 13, and a ground region (contact region) 14 are established. Reaction layers 20a and 20b of SiC and metal are provided on the drain region 12, the source region 13, and the ground region 14. Electrodes 21a and 21b are provided on the reaction layers 20a and 20b. The electrode 22 is placed on the bottom surface of the SiC substrate 6. A gate electrode 18 is placed on the epitaxial layer 7 via a gate insulating film 17 made by an $SiO_2$ film. An electrode 21c is placed on the gate electrode 18.

Next, with reference to FIG. 11A to FIG. 13C, an example of a manufacturing method of a semiconductor device according to the second modification according to the first embodiment of the present invention will be explained.

Figure 11A:
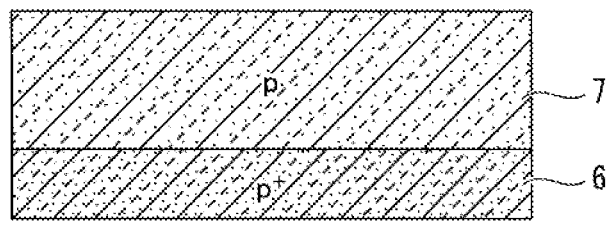
FIG. 11A to FIG. 11C are cross-sectional process views of the manufacturing method of the MOSFET according to the second modification of the first embodiment of the present invention.

First, the 4H-SiC substrate having the impurity concentration of about $5 \times 10^{17}$ to $3 \times 10^{18}$ $cm^{-3}$ ((000-1) plane 0 to 8 degrees off substrate, preferably 0 to 4 degrees off substrate) is prepared as the $p^+$-type SiC substrate 6. Then, as illustrated in FIG. 11A, the p-type the epitaxial layer 7 having the impurity concentration of about $1 \times 10^{16}$ $cm^{-3}$ is grown on the SiC substrate 6, thereby preparing the to-be-processed base (6, 7) having the SiC substrate 6 and the epitaxial layer 7.

Figure 11B:
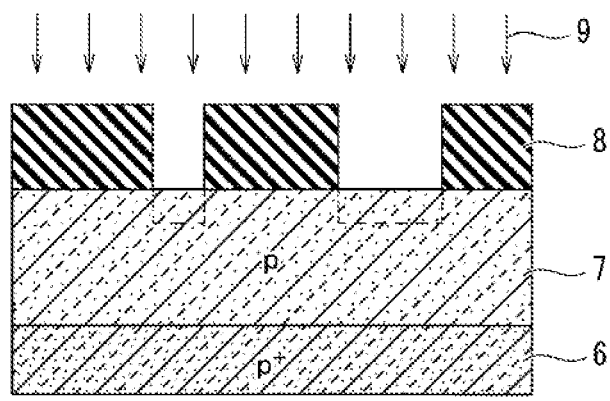

Next, the $SiO_2$ film having a thickness of 1 µm is deposited on the surface of the epitaxial layer 7 by Low Pressure (LP) CVD technique for example. Then, a photolithography technique is used to selectively remove a part of the $SiO_2$ film, thereby forming a pattern of a mask 8 made by an $SiO_2$ film as illustrated in FIG. 11B. Thereafter, the mask 8 is used to perform a selective ion implantation using for example phosphorus ions 9 together with the substrate temperature of 500 degrees C., the multistage acceleration energy of 40 keV to 250 keV, and the dose amount of $2 \times 10^{16}$ to $1 \times 10^{16}$ $cm^{-2}$ at each stage so that the final implantation amount of $1 \times 10^{20}$ to $1 \times 10^{21}$ $cm^{-3}$ is reached. Thereafter, the mask 8 is removed by the dry etching for example.

Figure 11C:
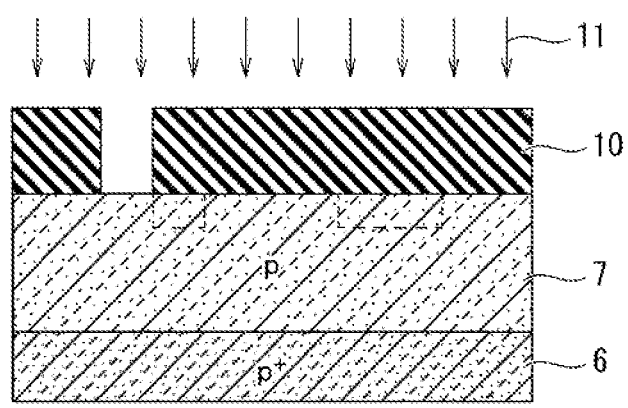
Figure 12A:
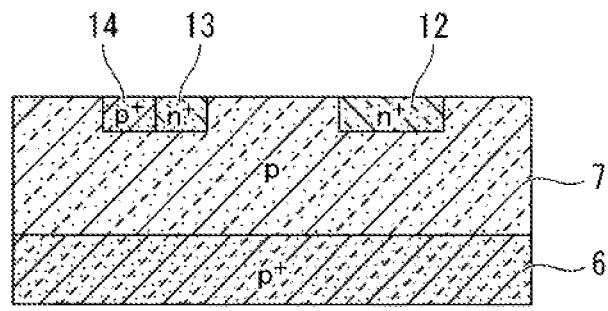
FIG. 12A to FIG. 12C are cross-sectional process views subsequent to FIG.

Next, the $SiO_2$ film having a thickness of 1 µm is deposited on the surface of the epitaxial layer 7 by an LPCVD method. Photolithography technique is used to selectively remove a part of the $SiO_2$ film to thereby form, as illustrated in FIG. 11C, the pattern of the mask 10 made by the $SiO_2$ film. Thereafter, the mask 10 is used to perform a selective ion implantation of the aluminium ion 11 for example with the substrate temperature of 500 degrees C., the multistage acceleration energy of 40 keV to 200 keV, and the dose amount in each stage of $5 \times 10^{16}$ to $2 \times 10^{16}$ $cm^{-2}$ so that the final implantation amount of $1 \times 10^{2o}$ to $1 \times 10^{21}$ $cm^{-3}$ is reached. Thereafter, the dry etching for example is used to remove the mask 10. Next, the activated annealing is performed in the Ar atmosphere at 1600 degrees C. for 5 minutes to thereby selectively form, as illustrated in FIG. 12A, the drain region 12, the source region 13, and the ground region 14 in the upper portion of the epitaxial layer 7.

Figure 12B:
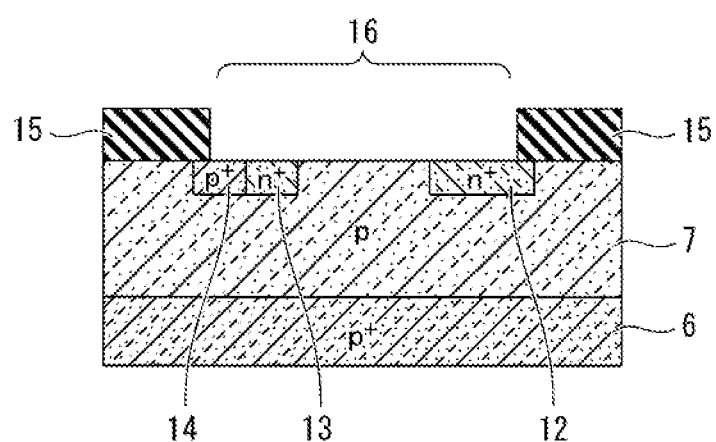

Next, an LPCVD method is used to deposit a field oxidation film 15 having a thickness of 0.5 µm. A photoresist film is coated on the field oxidation film 15 and a photolithography technique is used to delineate the photoresist film. A part of the field oxidation film 15 is removed by a wet etching using the delineated photoresist film as a mask to form a rectangular window defining an active area 16 as illustrated in FIG. 12B.

Figure 12C:
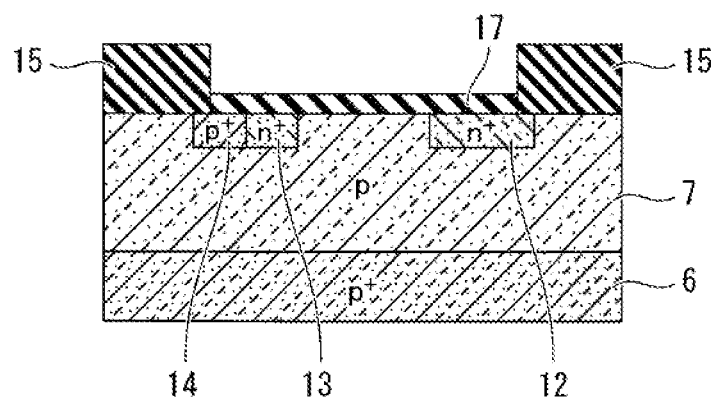

Next, after the to-be-processed base (6, 7) having the epitaxial layer 7 defining the active area 16 is washed, the above-described oxidation film formation process according to the first embodiment of the present invention is performed. For example, the to-be-processed base (6, 7) is placed on the susceptor 103 implemented by material including SiC. Then, the heating unit 102 is used to heat the to-be-processed base (6, 7) while monitoring the temperature using the temperature measurement unit 112 to thereby perform the oxidation process in the dry oxygen atmosphere of 1300 degrees C. As a result, as illustrated in FIG. 12C, the gate insulating film 17 made by an $SiO_2$ film having a thickness of 50 nm is formed on the surface of the epitaxial layer 7 within the active area 16. Thereafter, the vacuum pump 110 is used to perform the evacuation until the partial pressure of the oxidation agent has a pressure of 10 Pa or less. Thereafter, Ar gas is introduced to perform the substitution with the inert gas atmosphere. Thereafter, the temperature of the semiconductor base is lowered in the lower temperature process until 800 degrees C. or less is reached.

Figure 13A:
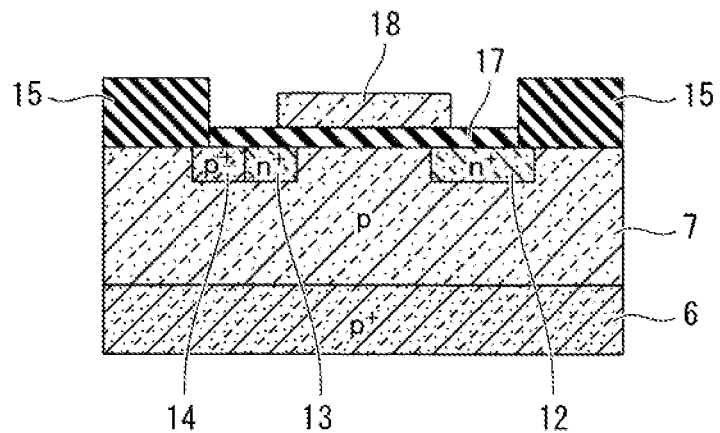
FIG. 13A to FIG. 13C are cross-sectional process views subsequent to FIG.
Figure 13B:
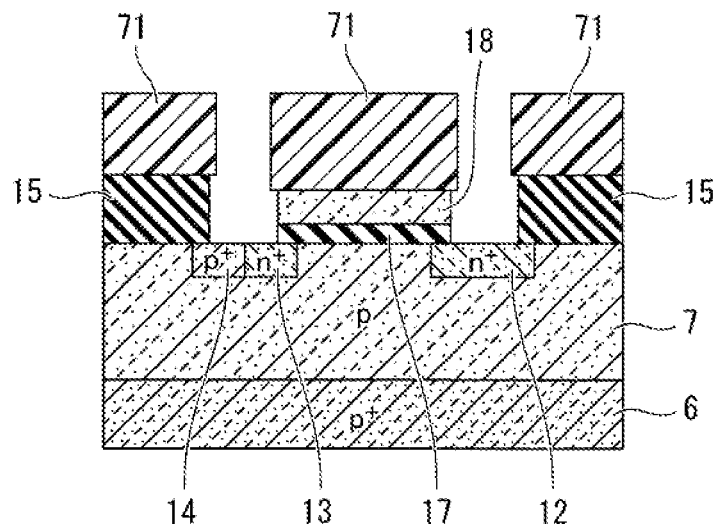
Figure 13C:
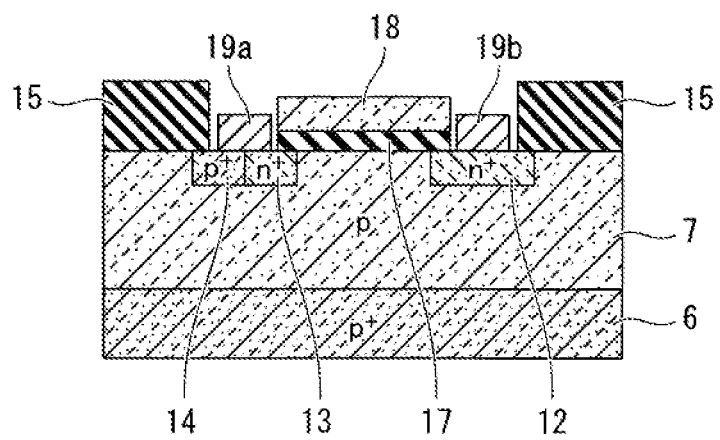

Next, a polycrystalline silicon film having a thickness of 0.3 µm is deposited on the gate insulating film 17 by an LPCVD method. A photolithography technique is used to subject the polycrystalline silicon film to a pattern processing to form the gate electrode 18 on the gate insulating film 17 as illustrated in FIG. 13A. A photolithography technique is used to form the etching mask of the photoresist film 71. This etching mask is used to etch the gate insulating film 17 by hydrofluoric acid for example, thereby selectively open contact holes in a part of the gate insulating film 17 as illustrated in FIG. 13B on the drain region 12, the source region 13, and the ground region 14. Al having a thickness of 10 nm and nickel (Ni) having a thickness of 60 nm are vacuum-evaporated on the photoresist film 71 used as an etching mask to deposit a multi-layer metal layer. After the vacuum evaporation, a wet processing for example is used to remove the photoresist film 71. A liftoff method is used to subject the multi-layer metallic film to a pattern processing to selective leave contact metals 19a and 19b in the interior of the contact holes as illustrated in FIG. 13C.

Figure 14A:
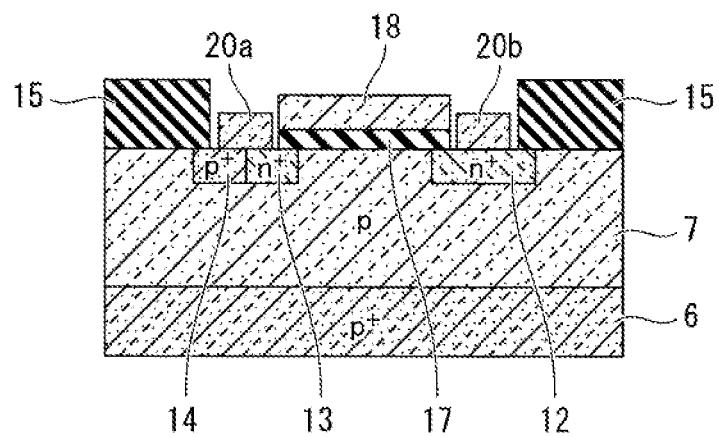
FIG. 14A and FIG. 14B are cross-sectional process views subsequent to FIG.
Figure 14B:
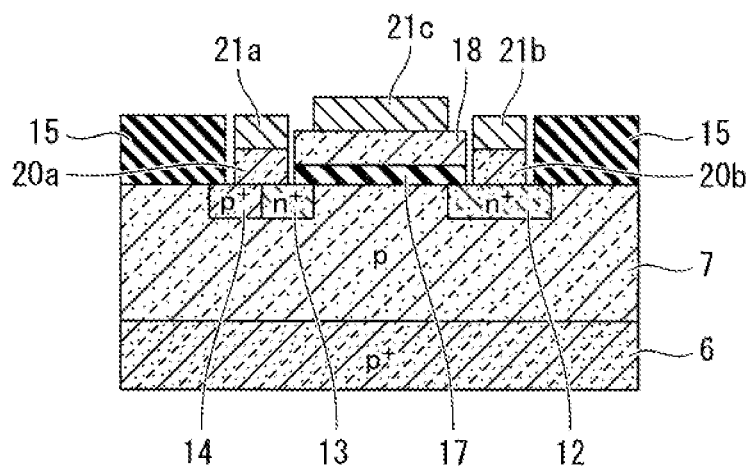

The heat treatment is performed as an ohmic contact annealing in the atmosphere of inert gas such as $N_2$, He, or Ar at 950 degrees C. for 2 minutes to form the reaction layers 20a and 20b in which the contact metals 19a and 19b react with SiC as illustrated in FIG. 14A. A metallic film made by Al is vapor-deposited on the surface to have 300 nm. A photolithography technique and the etching using phosphoric acid are used to form pad electrodes 21a to 21c on the gate electrode 18 and the reaction layers 20a and 20b as illustrated in FIG. 14B. Furthermore, the evaporation method for example is used to form the electrode 22 made by Al having a thickness of about 100 nm on the bottom surface, thereby completing the semiconductor device illustrated in FIG. 10.

According to the second modification, when the gate insulating film 17 of the MOSFET is formed, the partial pressure of the oxidation agent in the reaction tube 101 can be decreased to 10 Pa or less in the atmosphere substitution process to provide the partial pressure of the oxidation agent of 10 Pa or less at the start of the lower temperature process, thereby decreasing the interface level density between SiC and $SiO_2$. Thus, the gate insulating film 17 made by a high-quality $SiO_2$ film can be formed on the epitaxial layer 7. In the second modification, a case is described in which the oxidation film formation process not including the POA process illustrated in FIG. 2 is performed. However, the oxidation film formation process including the POA process illustrated in FIG. 8 also may be performed.

<Third Modification>

Figure 15:
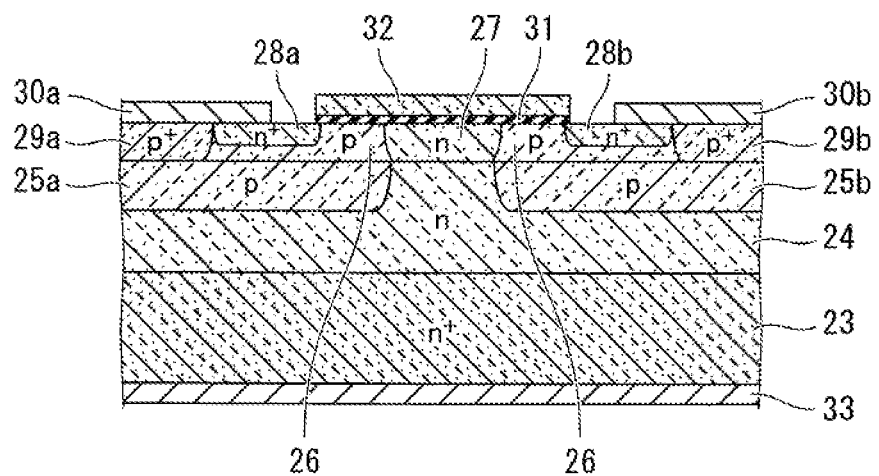
FIG. 15 is a cross-sectional view illustrating an example of a structure of the MOSFET according to a third modification of the first embodiment of the present invention.

As a semiconductor device according to the third modification of the first embodiment of the present invention, in the ON status, a vertical MOSFET that forms a channel in the vicinity of the surface of the SiC epitaxial substrate will be explained. The semiconductor device according to the third modification of the first embodiment of the present invention includes, as illustrated in FIG. 15, an $n^+$-type SiC substrate 23 and an n-type epitaxial layer 24 having a lower impurity concentration than that of the SiC substrate 23 and being placed on the SiC substrate 23.

A plurality of p-type regions 25a and 25b are selectively established on upper portions of the epitaxial layer 24. The p-type regions 25a and 25b are exposed at the surface of the epitaxial layer 24. A p-type SiC layer 26 having a lower impurity concentration than those of the p-type regions 25a and 25b is established on the surface of the p-type regions 25a and 25b. An n-type region 27 having the same thickness as that of the SiC layer 26 is established in the SiC layer 26 on the epitaxial layer 24 of which p-type regions 25a and 25b are not established. Specifically, the n-type region 27 penetrates through the SiC layer 26 in the depth direction and is sandwiched between two SiC layers 26 so as to reach the epitaxial layer 24. The n-type epitaxial layer 24 and the n-type region 27 are n-type drift regions. The n-type region 27 desirably has a higher impurity concentration than that of the n-type epitaxial layer 24.

$N^-$-type source regions 28a and 28b and $p^+$-type contact regions 29a and 29b are established on upper portions of the SiC layer 26 so as to be contacted with each other. The source regions 28a and 28b are established to be opposed to each other via the SiC layers 26 sandwiching the n-type region 27. The contact regions 29a and 29b are positioned at the opposite side of the n-type region 27 side of the source regions 28a and 28b. The contact regions 29a and 29b have impurity concentrations higher than that of the SiC layer 26. A part of the SiC layer 26 except for the source regions 28a and 28b, the contact regions 29a and 29b, and the n-type region 27 serves as a p-type base region together with the p-type regions 25a and 25b.

Source electrodes 30a and 30b are provided on the surfaces of the source regions 28a and 28b and the contact regions 29a and 29b. On the surfaces of the p-type SiC layer 26 and the n-type region 27 between the source regions 28a and 28b adjacent to each other, a gate electrode 32 is provided via a gate insulating film 31. The gate electrode 32 is electrically insulated from the source electrodes 30a and 30b by a not-illustrated interlayer insulating film (see the reference numeral 72 of FIG. 18B). A drain electrode 33 is provided on the bottom surface of the SiC substrate 23 so as to be contacted with SiC substrate 23.

Next, with reference to FIG. 16A to FIG. 17B, the following section will describe one example of a manufacturing method of a semiconductor device according to the third modification of the first embodiment of the present invention including the oxidation film formation process of the first embodiment of the present invention will be explained.

Figure 16A:
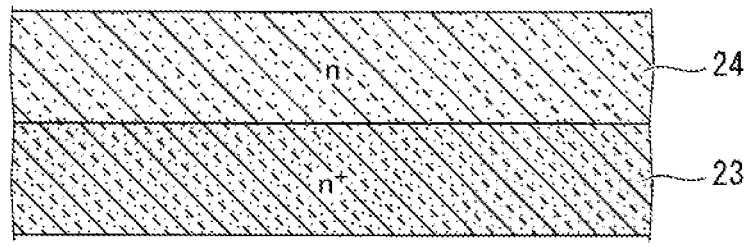
FIG. 16A to FIG. 16D are cross-sectional process views of the manufacturing method of the MOSFET according to the third modification of the first embodiment of the present invention.
Figure 16B:
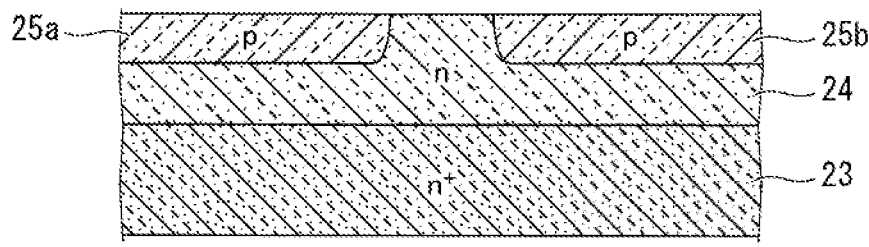
Figure 16C:
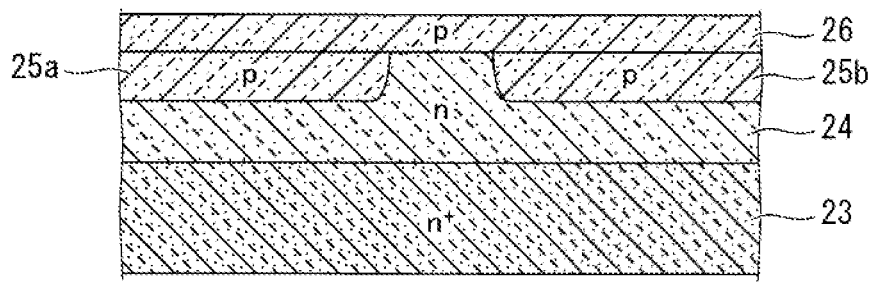

First, as illustrated in FIG. 16A, the n-type epitaxial layer 24 is grown on the n+-type SiC substrate 23 to prepare a preparation base (23, 24) having the SiC substrate 23 and the n-type epitaxial layer 24. Next, a photolithography technique, the ion implantation, and the heat treatment for example are used to selectively form, as illustrated in FIG. 16B, a plurality of the p-type regions 25a and 25b on upper portions of the epitaxial layer 24. Thereafter, as illustrated in FIG. 16C, the p-type SiC layer 26 having a lower impurity concentration than those of the p-type regions 25a and 25b are allowed to grow on the surfaces of the epitaxial layer 24 and the p-type regions 25a and 25b. By allowing the SiC layer 26 to grow, the preparation base (23, 24) is turned into the to-be-processed base (23, 24, 26).

Next, a photolithography technique, the ion implantation, and the heat treatment for example are used to form the n-type region 27 in a part of the SiC layer 26. The n-type region 27 is formed on the epitaxial layer 24 on which p-type regions 25a and 25b are not formed on a plane pattern. The p-type regions 25a and 25b penetrate through the SiC layer 26 in the depth direction and reach the epitaxial layer 24. The epitaxial layer 24 and the n-type region 27 are drift regions. The n-type region 27 desirably has an impurity concentration higher than that of the epitaxial layer 24.

Figure 16D:
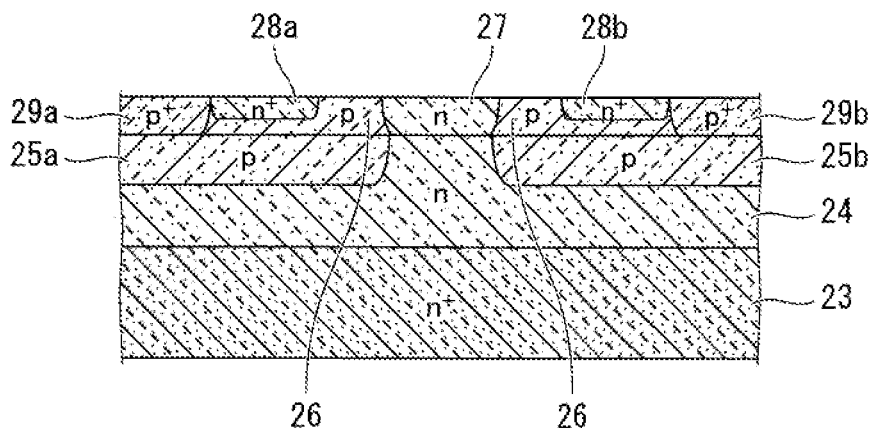

Furthermore, as illustrated in FIG. 16D, a photolithography technique, the ion implantation, and the heat treatment for example are used to form the p+-type contact regions 29a and 29b in the SiC layer 26. The contact regions 29a and 29b have impurity concentrations higher than that of the SiC layer 26. A photolithography technique, the ion implantation, and the heat treatment for example are used to form the n+-type source regions 28a and 28b in the SiC layer 26 by n+-type impurity ions such as phosphorus ions.

Figure 17A:
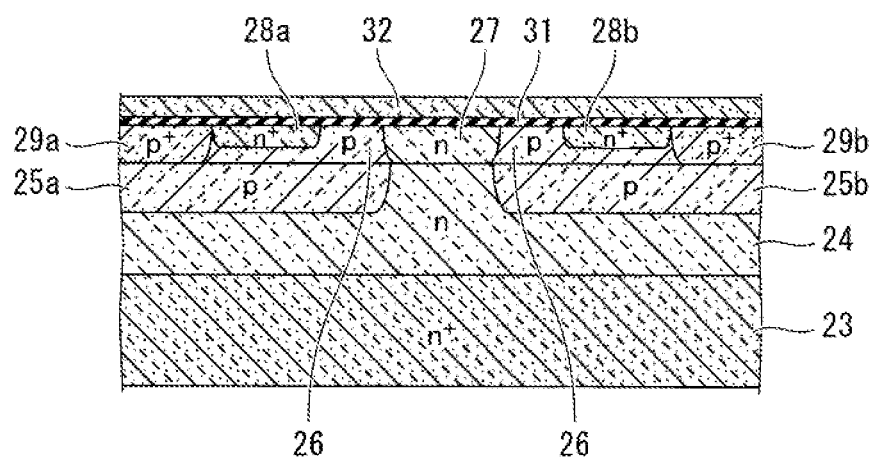
FIG. 17A to FIG. 17B are cross-sectional process views subsequent to FIG.
Figure 17B:
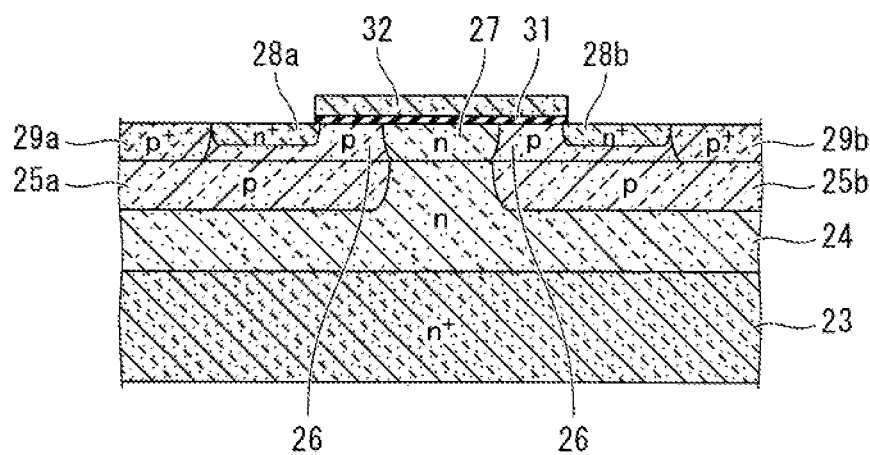

Next, the to-be-processed base (23, 24, 26) having the SiC substrate 23 and the n-type epitaxial layer 24 is introduced into the semiconductor manufacturing apparatus illustrated in FIG. 1. The oxidation film formation process according to the first embodiment of the present invention is used to thermally-oxidize, as illustrated in FIG. 17A, the surface of the SiC layer 26 to thereby form the gate insulating film 31 on the entire surface. Furthermore, a polysilicon layer 32 is deposited on the entire surface of the gate insulating film 31. A photolithography technique for example is used to selectively remove apart of the gate insulating film 31 and the polysilicon layer 32 to form, as illustrated in FIG. 17B, the gate electrode 32 via the gate insulating film 31 so that a part of the SiC layer 26 is exposed at the surfaces of the SiC layer 26 and the n-type region 27 between the contact regions 29a and 29b opposed to each other.

Figure 18A:
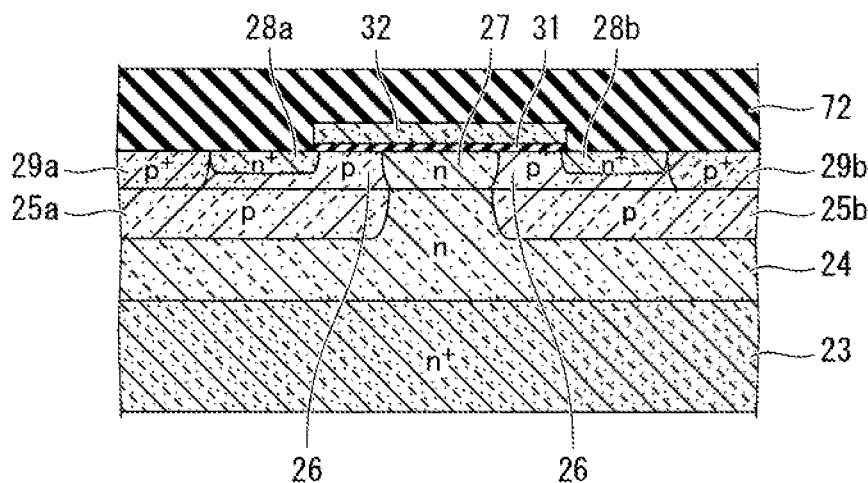
FIG. 18A and FIG. 18B are cross-sectional process views subsequent to FIG.
Figure 18B:
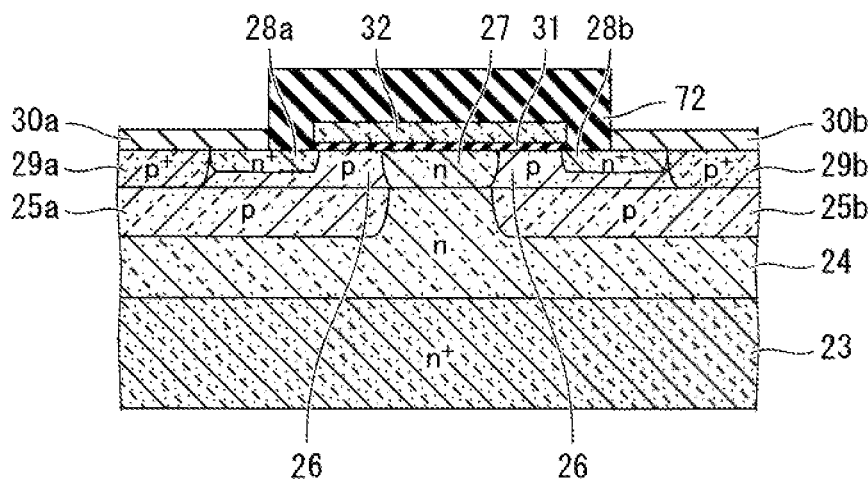

As illustrated in FIG. 18A, LPCVD method for example is used to deposit the interlayer insulating film 72 on the entire surface. Thereafter, a photolithography technique is used to selectively etch the interlayer insulating film 72 as illustrated in FIG. 18B to cover the gate electrode 32 with the interlayer insulating film 72. Although not illustrated, a gate contact hole is also opened during this selective etching.

As illustrated in FIG. 18B, the evaporation method or the sputtering method for example is used to form the source electrodes 30a and 30b on the surfaces of the source regions 28a and 28b and the contact regions 29a and 29b. A gate wiring is formed to be contacted with the gate electrode 32 via the gate contact hole. The evaporation method or the sputtering method for example is used to form, as illustrated in FIG. 15, the drain electrode 33 on the bottom surface of the SiC substrate 23 to thereby complete the semiconductor device according to the third modification of the first embodiment of the present invention.

(Second Embodiment)

Figure 19:
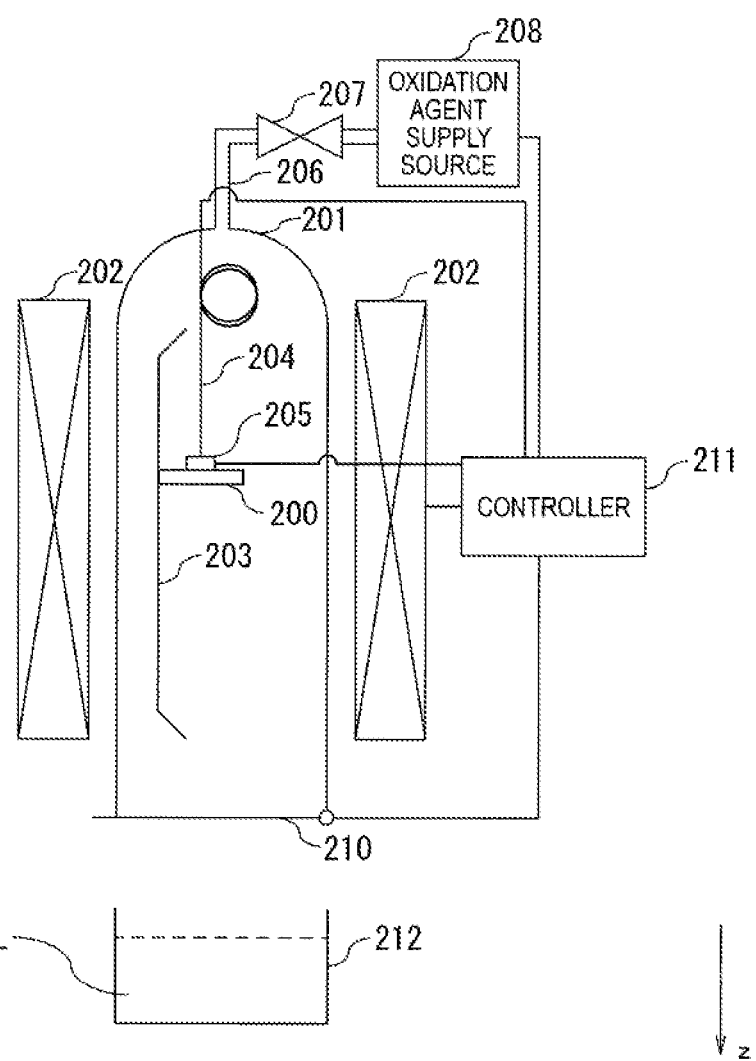
FIG. 19 is a schematic view illustrating an example of a semiconductor manufacturing apparatus (oxidation furnace) according to a second embodiment of the present invention.

A semiconductor manufacturing apparatus according to a second embodiment of the present invention is an oxidation furnace that includes, as illustrated in FIG. 19, a reaction tube 201 for storing a to-be-processed base made by SiC as body material (semiconductor base) 200, a heating unit 202 provided at the periphery of the reaction tube 201, and a susceptor 203 provided in the reaction tube 201. In FIG. 19, the axis z represents the gravitational acceleration direction, the lower side represents the positive direction of the axis z, and the upper side represents the negative direction of the axis z.

The to-be-processed base 200 made by SiC as body material has a single layer structure of an SiC substrate or a multi-layer structure in which the uppermost surface is an SiC layer. The reaction tube 201 is delineated by substantially-cylindrical quartz for example. The heating unit 202 heats the to-be-processed base 200. The heating unit 202 may be an infrared lamp or a high-frequency induction heating device for example. The susceptor 203 preferably made by material including SiC or alumina ($Al_2O_3$).

In the reaction tube 201, a wire 204 is provided that is joined to the to-be-processed base 200 so as to retain the to-be-processed base 200. A retainer 205 is provided in the vicinity of a portion at which the wire 204 is joined to the to-be-processed base 200. At the lower side of the reaction tube 201, a liquid bath 212 is provided in which liquid L is poured.

Figure 20:
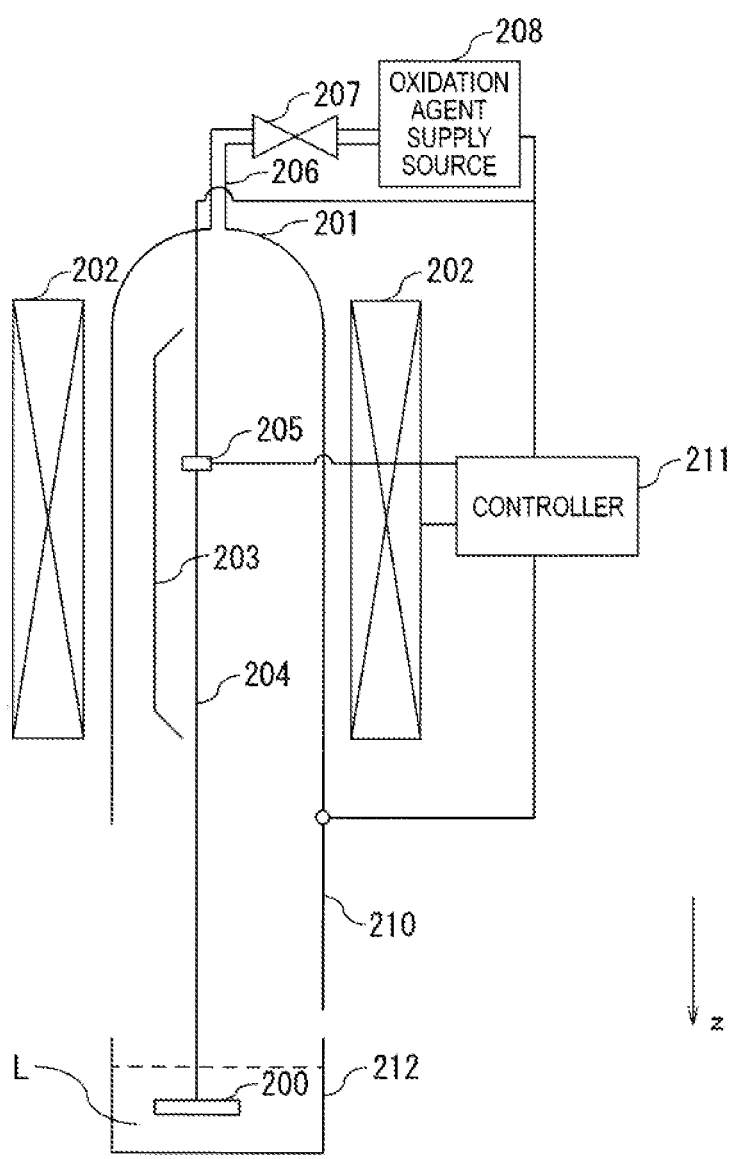
FIG. 20 is a schematic view illustrating one example of the semiconductor manufacturing apparatus (oxidation furnace) according to the second embodiment of the present invention.

The retainer 205 has a function to retain or separate the to-be-processed base 200 in accordance with a control signal from a controller 211. By allowing the retainer 205 to separate the to-be-processed base 200, the to-be-processed base 200 downwardly falls as illustrated in FIG. 20 and is dropped into the liquid L of the liquid bath 212. The arrangement and position of the retainer 205 is not particularly limited so long as the to-be-processed base 200 can be retained in the reaction tube 201. Although a case is illustrated in FIG. 20 in which the retainer 205 separated from the to-be-processed base 200 is allowed to remain in the reaction tube 201, another configuration also may be used in which the retainer 205 detached from the reaction tube 201 is allowed to fall together with the to-be-processed base 200.

The wire 204 is a sheath thermocouple for example and can measure the temperatures of the interior of the reaction tube 201 and the to-be-processed base 200. A sheath thermocouple constituting the wire 204 for example preferably has a length that can at least sufficiently reach the liquid bath 212. When the retainer 205 is separated from the to-be-processed base 200 and the to-be-processed base 200 falls into the liquid bath 212, a status can be maintained in which the sheath thermocouple constituting the wire 204 is connected to the to-be-processed base 200. Thus, even after the to-be-processed base 200 is dropped into the liquid bath 212, the temperature of the to-be-processed base 200 can be measured, thus providing the detection of the temperature of the to-be-processed base 200 until a temperature at which the oxidization stops is reached. Another configuration also may be used in which the retainer 205 is separated from the to-be-processed base 200 while the wire 204 is separated from the to-be-processed base 200.

An opening lid 210 is provided at the lower side of the reaction tube 201. The opening lid 210 may be opened using a single door or a slide for example. The opening lid 210 is opened or closed in accordance with on the control signal from the controller 211. When the opening lid 210 is closed, the reaction tube 201 is sealed to prevent the oxidation gas from being emitted to the exterior of the reaction tube 201.

On the other hand, as illustrated in FIG. 20, the opening lid 210 can be opened to allow the to-be-processed base 200 to be taken out to the exterior of the reaction tube 201.

In the liquid bath 212, the liquid L is poured that can rapidly cool the to-be-processed base 200 fallen from the interior of the reaction tube 201. The liquid L has a temperature set to be lower than a predetermined temperature to cool the to-be-processed base 200. The term "rapidly cool" means that the cooling until the predetermined temperature is reached is completed within 2 seconds from the completion of the formation of the oxidation film. The term "predetermined temperature" means a temperature of 800 degrees C. at which the oxidation of the surface of the to-be-processed base 200 is stopped in the dry oxygen atmosphere for example. The cooling to the predetermined temperature within 2 seconds from the completion of the formation of the oxidation film allows the oxidation film to grow to have a size of 0.1 nm or less during the cooling during the cooling.

The liquid L poured in the liquid bath 212 may be water for example but is not limited so long as the liquid L can rapidly cool the to-be-processed base 200 fallen from the interior of the reaction tube 201. For example, the liquid L may be other liquids having a thermal conductivity similar to that of water for example. Since water evaporates at 100 degrees C. and turns into gas, when the cooling is desired to be carried out within a range from 100 degrees C. to 800 degrees, liquid metal existing as liquid in the range from 100 degrees C. to 800 degrees C. such as mercury (Hg), gallium (Ga), indium (In), or tin (Sn) may be used. Note that, since Hg has an evaporation temperature of 480 degrees C., a temperature at which Hg can be used as liquid for the cooling is lower than 800 degrees C.

As illustrated in FIG. 19, the upper side (upstream side) of the reaction tube 201 is connected to one end of a gas supply tube 206. The other end of the gas supply tube 206 is connected to an oxidation agent supply source 208. In the middle of the path of the gas supply tube 206, a gas valve 207 is provided that can adjust the gas flow rate. The oxidation agent supply source 208 supplies gas (oxidation gas) including $O_2$, water vapor ($H_2O$), NO, $N_2O$, or the mixed gas of these gases to the reaction tube 201 via the gas supply tube 206. A not-illustrated vacuum pump also may be connected to the downstream side of the reaction tube 201.

The controller 211 is electrically connected to the heating unit 202, the retainer 205, the gas valve 207, the oxidation agent supply source 208, the wire 204, and the opening lid 210. The controller 211 controls the heating temperature by the heating unit 202, the oxidation agent flow rate, the joint and the separation of the retainer 205 and the to-be-processed base 200, and the opening and closing of the opening lid 210 for example based on the temperatures of the interior of the reaction tube 201 and the to-be-processed base 200 measured by the wire 204 or the time shown by a timepiece (not illustrates) owned by the controller 211. The controller 211 is implemented by a microprocessor and a memory for example having the function of a CPU for example.

<Oxidized Film Formation Method>

Figure 21:
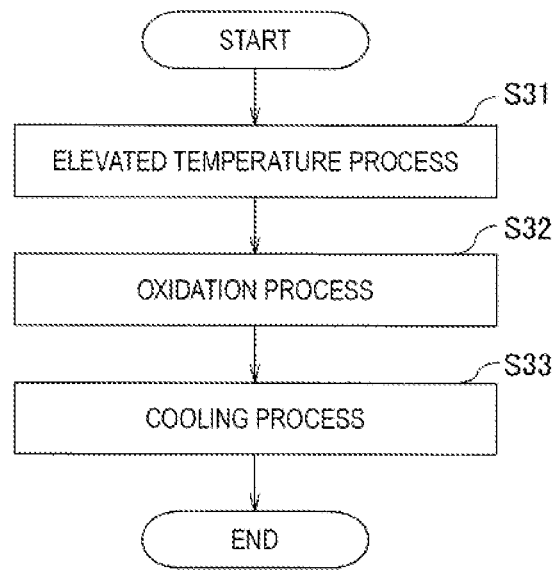
FIG. 21 is a flowchart illustrating the oxidation film formation process according to the second embodiment of the present invention.
Figure 22:
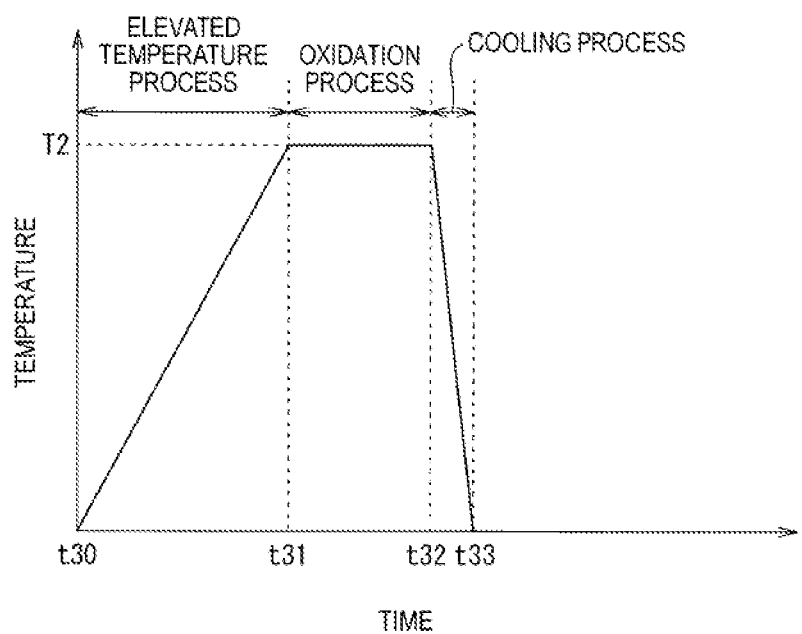
FIG. 22 is a timing chart illustrating the temperature changes of the oxidation film formation process according to the second embodiment of the present invention.

Next, with reference to FIG. 19 to FIG. 22, an example of the oxidation film formation process using the semiconductor manufacturing apparatus according to the second embodiment of the present invention illustrated in FIG. 19 will be explained. FIG. 21 is a flowchart illustrating the oxidation film formation process according to the second embodiment of the present invention. FIG. 22 is a timing chart illustrating the temperature change of the oxidation film formation process according to the second embodiment of the present invention. As illustrated in the flowchart of FIG. 21, the oxidation film formation process includes the elevated temperature process of step S31, the oxidation process of step S32, and the cooling process of step S33.

As illustrated in FIG. 19, the to-be-processed base 200 made by SiC as body material is placed in the susceptor 203 of the reaction tube 201. The to-be-processed base 200 is joined to one end of the wire 204. The to-be-processed base 200 is retained by the retainer 205 so that the to-be-processed base 200 can freely fall when being separated from the retainer 205. The to-be-processed base 200 may be hung from the wire 204 without being placed in the susceptor 203 or also may be retained only by the retainer 205.

First, the elevated temperature process of step S31 of FIG. 21 is performed. In the elevated temperature process, as illustrated in FIG. 22, the to-be-processed base 200 is heated at the times t30 to t31 by the heating unit 202 to rise the temperatures of the reaction tube 201 and to-be-processed base 200 until the predetermined temperature T2 is reached. The predetermined temperature T2 is equal to or higher than the temperature at which SiC can be thermally-oxidized. The predetermined temperature T2 is preferably 1250 degrees C. or more and is 1600 degrees C. or less. As will be described later, a temperature lower than 1250 degrees C. tends to cause an interface defects to be easily formed in the oxidation film. The reason is that an oxidation film formed at this temperature causes the interface level density $D_{it}$ to be higher. The time period from the times t30 to t31 is about 10 minutes for example.

Next, the oxidation process of step S32 of FIG. 21 is performed. In the oxidation process, as illustrated in FIG. 22, at the times t31 to t32, the heating is continued by the heating unit 202 to retain the temperature of the to-be-processed base 200 measured by the wire 204 at a temperature similar to the predetermined temperature T2. The oxidation agent supply source 208 supplies gas (oxidation gas) including $O_2$, water vapor (H2O), NO, $N_2O$, or the mixed gas of these gases to the reaction tube 201 via the gas supply tube 206, thereby providing the dry oxygen atmosphere in the reaction tube 201. As a result, the surface of the to-be-processed base 200 is thermally-oxidized in the dry oxygen atmosphere having an atmosphere pressure to thereby form an $SiO_2$ film having a thickness of about 40 nm for example. The time period from the times t31 to t32 is about 5 minutes for example.

Next, the cooling process of step S33 of FIG. 21 is performed. In the cooling process, as illustrated in FIG. 22, at the time t32, the heating by the heating unit 202 is stopped and the to-be-processed base 200 is separated from the retainer 205 and the opening lid 210 is opened. The timing at which the retainer 205 is separated from the to-be-processed base 200 is preferably prior to the opening of the opening lid 210 if to-be-processed base 200 does not contact with the closed opening lid 210. However, this timing also may be immediately after the closing of the opening lid 210.

The timing at which the heating by the heating unit 202 is stopped may be prior to the separation of the retainer 205 from the to-be-processed base 200, after the separation of the retainer 205 from the to-be-processed base 200, or simultaneous with the separation of the retainer 205 from the to-be-processed base 200. The timing at which the heating by the heating unit 202 is stopped may be prior to the opening of the opening lid 210, after the opening of the opening lid 210, or simultaneous with the opening of the opening lid 210.

As illustrated in FIG. 20, when the retainer 205 is separated from the to-be-processed base 200, the to-be-processed base 200 falls. Since the opening lid 210 is being opened, the to-be-processed base 200 is released from the reaction tube 201 and is dropped into the liquid bath 212. In order to rapidly cool to-be-processed base 200, the liquid L having a temperature of 800 degrees C. or less is poured in the liquid bath 212. The liquid L has a higher thermal conductivity than that of gas, the to-be-processed base 200 is cooled rapidly.

As illustrated in FIG. 22, the cooling of the to-be-processed base 200 is completed by the time t33. The time period from the times t32 to t33 is within 2 seconds for example.

In this manner, a series of processes in the oxidation film formation process according to the second embodiment of the present invention are completed. By performing the oxidation film formation process according to the second embodiment of the present invention, an oxidation film is formed on to-be-processed base 200. The characteristic of the oxidation film formed by the oxidation film formation process according to the second embodiment of the present invention will be explained bellow.

Figure 23:
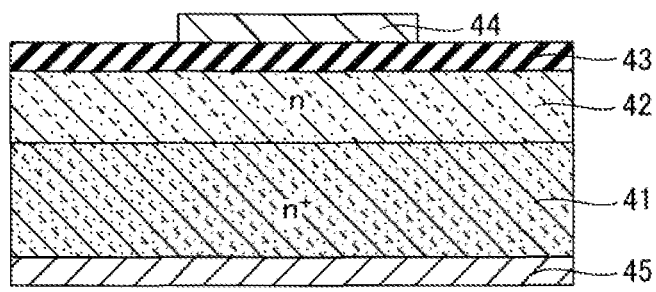
FIG. 23 is a cross-sectional view illustrating a structure of an MOS capacitor including an oxidation film.

FIG. 23 is a cross-sectional view illustrating the structure of the MOS capacitor including an oxidation film. As illustrated in FIG. 23, the MOS capacitor is configured so that an epitaxial layer 42 made by n-type SiC is deposited on the first principal plane (top surface) of the n$^+$-type SiC substrate 41 (e.g., (0001) plane (Si plane)). The base (41, 42) having both the SiC substrate 41 and the epitaxial layer 42 corresponds to the to-be-processed base 200 illustrated in FIG. 19 and FIG. 20.

A capacitor insulating film 43 is provided at the surface of SiC epitaxial layer 42 at the opposite side of the SiC substrate 41. A capacitor insulating film 43 corresponds to the above-described oxidation film. An electrode 44 is provided at a part of the surface of the capacitor insulating film 43 at the opposite side of the SiC substrate 41. An electrode 45 is provided on the second principal plane (back surface) of the SiC substrate 41.

<Example>

In order to measure of the interface level density of the oxidation film according to the second embodiment of the present invention, as an Example, the capacitor insulating film 43 of the MOS capacitor illustrated in FIG. 23 is illustratively subjected to the flowchart illustrated in FIG. 21 to thereby form an oxidation film on the to-be-processed base 200.

As Comparative Examples to be compared as the Example, a Comparative Example A is prepared in which, after the elevated temperature process of step S31 of the flowchart illustrated in FIG. 21 and the oxidation process of step S32 are performed, the MOS capacitor is cooled for about 5 minutes until the temperature is 800 degrees C. or less. A Comparative Example B is prepared in which, after the elevated temperature process of step S31 of the flowchart illustrated in FIG. 21 and the oxidation process of step S32 are performed, the MOS capacitor is cooled for about 30 seconds until the temperature is 800 degrees C. or less. For example, according to the Comparative Example A, the MOS capacitor is cooled by placing the MOS capacitor on a susceptor made by alumina. According to the Comparative Example B, the MOS capacitor is cooled by placing the MOS capacitor on a susceptor made by SiC.

Figure 24:
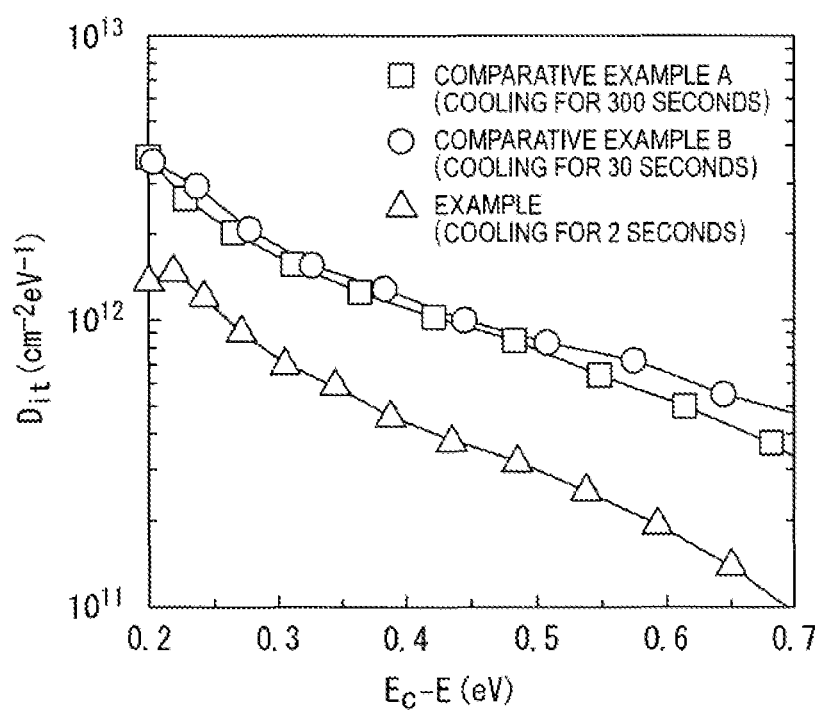
FIG. 24 is a graph illustrating the measurement values of the interface level densities of the oxidation film of an Example and the oxidation film of a Comparative Example.

The MOS capacitors of the Example, the Comparative Example A, and the Comparative Example B were measured by a C-V meter to investigate a difference in the interface level density $D_{it}$ based on the High-Low technique using the C-V characteristic of 1 MHz and the quasi-static C-V characteristic. FIG. 24 is a graph illustrating the measurement values of the interface level densities $D_{it}$ of the oxidation film of the Example and the oxidation films of the Comparative Examples A and B. In FIG. 24, the horizontal axis represents the interface level energy in the bandgap (Ec represents the conduction band energy end) and the vertical axis represents the interface level density $D_{it}$.

As illustrated in FIG. 24, it can be seen that the Example provides a lower interface level density $D_{it}$ than those of the Comparative Example A and the Comparative Example B at all energies. It is recognized that a high effectiveness is obtained to decrease the deep energy (or high Ec-E) interface level density $D_{it}$. When the Comparative Example B is compared with the Comparative Example A, although the decrease effectiveness is recognized at the interface level density $D_{it}$ having the deep energy, the decrease effectiveness is low. Thus, it can be seen that the effectiveness to decrease the interface level density $D_{it}$ is low when the cooling to 800 degrees C. or less is performed within about 30 seconds. The reason is that an oxidation film is further formed when the MOS capacitor has a temperature of 1250 degrees C. to 800 degrees C. to cause the tendency to form an interface defects and this oxidation film cause the interface level density $D_{it}$ to be higher.

Next, the following section will describe that the interface defects tends to be formed on the oxidation film when the temperature T2 to be rised is lower than 1250 degrees C. in the elevated temperature process of step S31 of FIG. 21 as described above. The Comparative Examples a to f are prepared in order to investigate the relation between the oxidation film formation temperature and the interface level density. The Comparative Example a is prepared by setting the oxidation film formation temperature to 1150 degrees C. and performing the elevated temperature process of step S31 of the flowchart illustrated in FIG. 21 and the oxidation process of step S32 to subsequently cool the MOS capacitor for the time of 30 seconds or more until the 800 degrees C. or less is reached. The Comparative Examples b to f are examples in which the oxidation film formation temperature are set to 1200 degrees C., 1250 degrees C., 1300 degrees C., 1450 degrees C., and 1600 degrees C., respectively.

Figure 25:
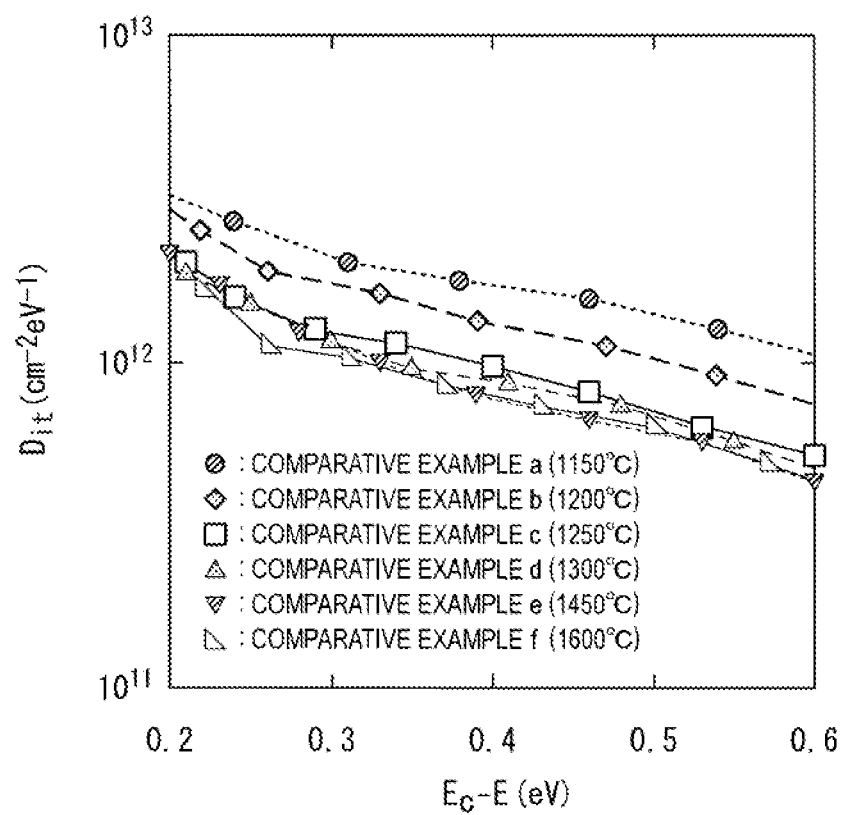
FIG. 25 is a graph illustrating the measurement values of the interface level densities at various oxidation film formation temperatures.

FIG. 25 is a graph illustrating the measurement values of the interface level densities at various oxidation film formation temperatures. As illustrated in FIG. 25, it is recognized that the Comparative Example b shows the lower interface level density $D_{it}$ than that of the Comparative Example a and the Comparative Example c shows the lower interface level density $D_{it}$ than that of the Comparative Example b. On the other hand, the Comparative Examples c to f shows no significant difference in the decrease of the interface level density $D_{it}$. Thus, it can be seen that the oxidation film formation temperature from 1250 degrees C. to 1600 degrees C. suppresses the interface defects from being formed while the oxidation film formation temperature from 1250 degrees C. to 1600 degrees C. can decrease the interface level density $D_{it}$. On the contrary, it can be seen that the oxidation film formation temperature lower than 1250 degrees C. tends to cause the formation of the interface defects and the oxidation film formation temperature lower than 1250 degrees C. allows the interface level density $D_{it}$ to be higher.

As described above, according to the second embodiment of the present invention, the time period during which the interface defects tends to be formed can be decreased by lowering the temperature of the SiC substrate to a temperature at which the oxidization of the surface is stopped within 2 seconds from the completion of the formation of the oxidation film. This can consequently decrease the time period during which an oxidation film is formed on the surface of the SiC substrate while the interface defects tends to be formed, thus decreasing the interface defects formed on the surface of the SiC substrate. Thus, the interface level density on the surface of the SiC substrate can be decreased.

<First Modification>

Figure 26:
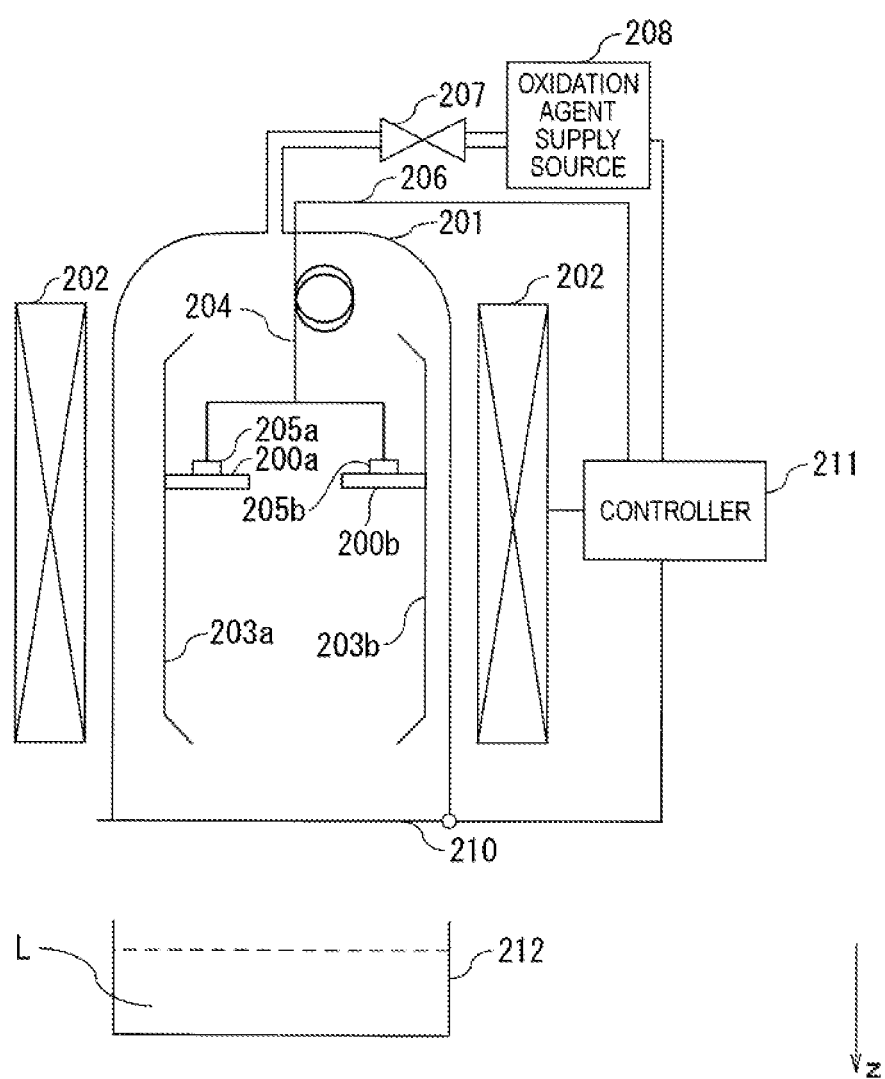
FIG. 26 is a schematic view illustrating an example of a semiconductor manufacturing apparatus (oxidation furnace) according to a first modification of the second embodiment of the present invention.

As illustrated in FIG. 26, an oxidation furnace according to the first modification of the second embodiment of the present invention is different from the structure of the oxidation furnace according to the second embodiment of the present invention illustrated in FIG. 19 in that the lower side of the wire 204 has a plurality of retainers 205a and 205b and stores a plurality of to-be-processed bases 200a and 200b. FIG. 26 illustrates a case where the two retainers 205a and 205b as well as the two to-be-processed bases 200a and 200b are provided in the number of two, respectively. However, the numbers of the retainers and the to-be-processed bases are not particularly limited.

The to-be-processed base 200a is provided in the susceptor 203a, and the to-be-processed base 200b is provided in the susceptor 203b. In the cooling process after the completion of the oxidation film formation of the plurality of to-be-processed bases 200a and 200b, when the plurality of retainers 205a and 205b are separated from the plurality of to-be-processed bases 200a and 200b, the plurality of to-be-processed bases 200a and 200b fall and are dropped into the liquid bath 212, thereby being cooled rapidly. As a result, high-quality oxidation films can be collectively formed to the plurality of to-be-processed bases 200a and 200b.

Figure 27:
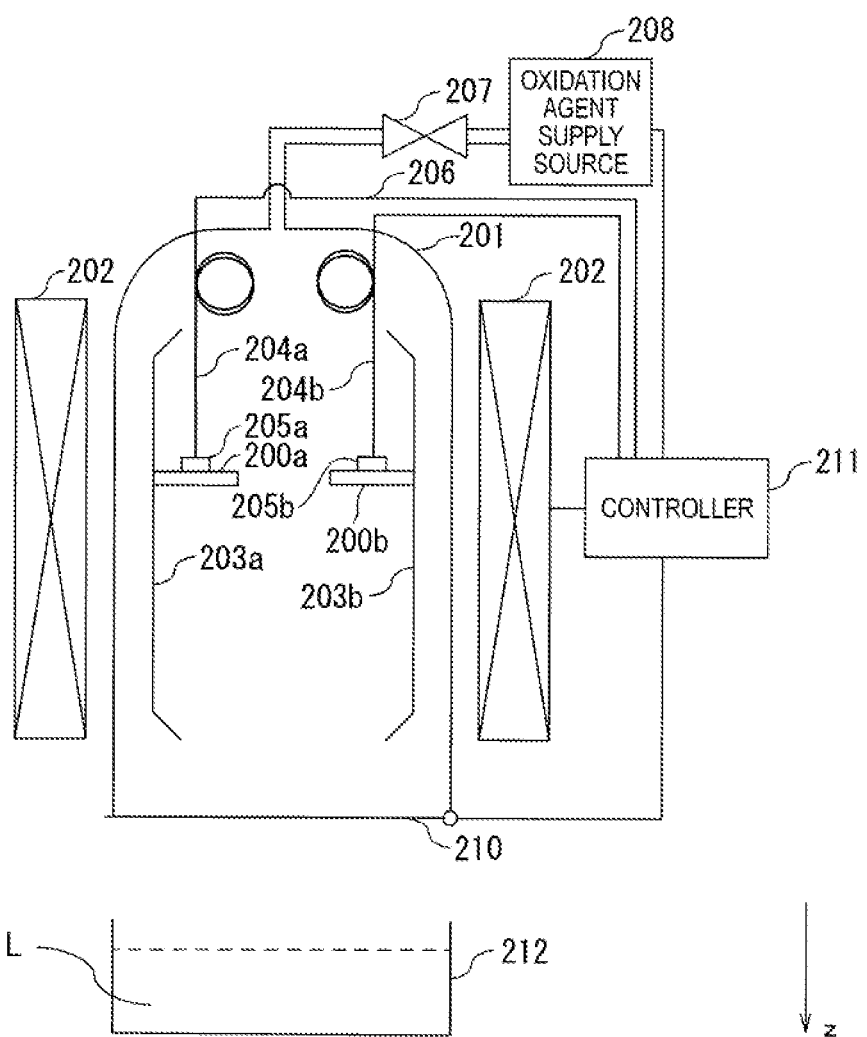
FIG. 27 is a schematic view illustrating another example of the semiconductor manufacturing apparatus (oxidation furnace) according to the first modification of the second embodiment of the present invention.

As illustrated in FIG. 27, another structure also may be used that has the plurality of wires 204a and 204b and that stores the plurality of to-be-processed bases 200a and 200b connected to the plurality of wires 204a and 204b, respectively. By having the plurality of wires 204a and 204b, the temperatures of the plurality of to-be-processed bases 200a and 200b also can be detected individually.

<Second Modification>

The second embodiment of the present invention has illustrated a method of rapidly cooling the to-be-processed base 200 by dropping the to-be-processed base 200 into the liquid bath 212. However, the method of rapidly cooling the to-be-processed base 200 is not limited to this. Specifically, any method may be used so long as the method can rapidly cool the to-be-processed base 200 so that an oxidation film can be grown to have a size of 0.1 nm or less during the time period from the completion of the oxidation film formation to lowering the temperature to a temperature at which the oxidization of the surface is stopped.

Figure 28:
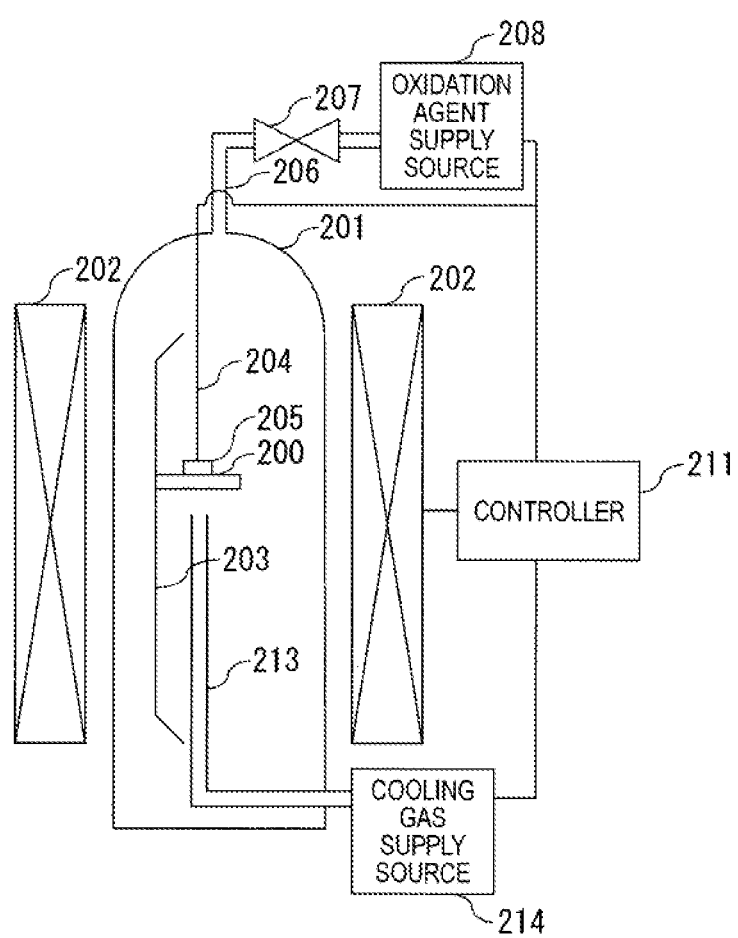
FIG. 28 is a schematic view illustrating an example of a semiconductor manufacturing apparatus (oxidation furnace) according to the second modification of the second embodiment of the present invention.

For example, as illustrated in FIG. 28, the oxidation furnace according to a second modification of the second embodiment of the present invention is different from the structure of the oxidation furnace according to the second embodiment of the present invention illustrated in FIG. 19 in that a cooling gas supply tube 213 made by a quartz tube for example one end of which is provided in the vicinity of the to-be-processed base 200 is provided in the reaction tube 201. The other end of the cooling gas supply tube 213 is connected to a cooling gas supply source 214.

In the oxidation film formation process using the oxidation furnace according to the second modification of the second embodiment of the present invention, after the completion of the oxidation film formation of the to-be-processed base 200, a large amount of low-temperature gas can be blown to the to-be-processed base 200 from the cooling gas supply source 214 via the cooling gas supply tube 213, thereby rapidly cooling the to-be-processed base 200. If non-oxidizing gas is used as the low-temperature gas, the oxidation film having a size of 0.1 nm or less can be grown even if lowering the temperature requires 2 seconds or more.

(Other Embodiments)

As described above, the present invention has been described by way of the first and second embodiments. However, it should not be understood that the description and drawings constituting a part of this disclosure limit the present invention. Various substitutions, embodiments, and techniques will be clear for those skilled in the art from this disclosure.

For example, in the first embodiment of the present invention, a horizontal MOSFET manufacturing method using an SiC substrate has been described as an example as a semiconductor device. However, the invention is not limited to this. Another MOSFET such as a vertical MOSFET using an SiC substrate also may be used. The invention also can be applied to a semiconductor device having various high-voltage structures such as a MOS static induction transistor (SIT), IGBT, or a static induction thyristor having an MOS gate structure to provide a similar effectiveness. The MOS gate structure is also not limited to a plane gate structure and also may be a trench gate or a further complicated MOS gate structure.

Although the second embodiment of the present invention has illustrated an MOS capacitor using SiC as a semiconductor device, the invention is not limited to this. The invention also can be applied to a horizontal MOSFET using the SiC substrate illustrated in the first embodiment of the present invention. The invention also can be applied to a semiconductor device having a high-voltage structure such as a MOSFET, MOSSIT, IGBT, or a static induction thyristor having MOS gate structure to provide a similar effectiveness. The MOS gate structure is also not limited to a plane gate structure and also may be a trench gate or a further complicated MOS gate structure.

In the first embodiment of the present invention, a horizontal semiconductor manufacturing apparatus has been described in FIG. 1. However, a vertical semiconductor manufacturing apparatus also may be used. The semiconductor manufacturing apparatus first and second embodiments of the present invention are not required to be a single oxidation furnace and also may be a general-purpose furnace having a function as a diffusion furnace or an annealing furnace.

In the first and second embodiments of the present invention, the to-be-processed base (1, 2) having the SiC substrate 1 and the SiC layer 2, the to-be-processed base (6, 7) having the SiC substrate 6 and the epitaxial layer 7, the to-be-processed base (23, 24, 26) having the SiC substrate 23, the epitaxial layer 24 and the SiC layer 26, and the to-be-processed base (41, 42) having the SiC substrate 41 and the epitaxial layer 42 have been illustratively described. However, the "to-be-processed base" of the present invention is not limited to a multi-layer structure as illustrated and also may be a single semiconductor substrate. Alternatively, the part of the epitaxial layer 24 may be substituted with an SiC substrate and the part of the SiC substrate 23 may be substituted with an epitaxial growth layer or an impurity introduction layer in FIG. 15 for example.

The semiconductor manufacturing apparatus and the manufacturing method of a semiconductor device according to the first and second embodiments of the present invention also may be appropriately combined. For example, the semiconductor manufacturing apparatus according to the first embodiment of the present invention illustrated in FIG.

1 also may be the vertical one and the wire 204, the retainer 205, the opening lid 210, and the liquid bath 212 for example owned by the semiconductor manufacturing apparatus according to the second embodiment of the present invention illustrated in FIG. 19 also may be further provided.

In the manufacturing method of a semiconductor device according to the first embodiment of the present invention, when the lower temperature process of step S13 of FIG. 2 is performed, the to-be-processed base 100 may be allowed to fall into the water in the liquid bath 212 to rapidly cool the to-be-processed base 100. Specifically, the cooling time of the to-be-processed base 100 of the times t14 to t15 illustrated in FIG. 3A to FIG. 3C may be 2 seconds or less. The oxidation film also may be grown to have a size of 0.1 nm or less from the times t14 to t15. Similarly, when the lower temperature process of step S24 of FIG. 8 is performed, the time period from the times t26 to t27 illustrated in FIG. 9A to FIG. 9C may be 2 seconds or less and the oxidation film may be grown to have a size of 0.1 nm or less from the times t26 to t27.

As described above, the invention can be applied to various manufacturing methods of a semiconductor device and a semiconductor manufacturing apparatus used for them within a range not deviating from the present invention disclosed in the claims.

[Industrial Applicability]

A manufacturing method of a semiconductor device and a semiconductor manufacturing apparatus used for this according to the present invention also can be effectively used for a power source device of various industrial machines and a high-voltage semiconductor device used for an electric power conversion device as well as high-voltage semiconductor devices used for other electric power transmissions for example.

What is claimed is:

1. A method for manufacturing a semiconductor device, comprising:
    thermally-oxidizing a surface of a to-be-processed base made by SiC as body material to form a silicon dioxide film, by supplying gas containing oxidation agent to the surface of the to-be-processed base, wherein the formation of the silicon dioxide film is performed at a temperature range between 1250 degrees C. or more and 1600 degrees C. or less;
    exchanging ambient gas containing the oxidation agent after forming the silicon dioxide film, by decreasing a partial pressure of the oxidation agent in the ambient gas to 10 Pa or less by evacuating the ambient gas remaining in a reaction tube storing the to-be-processed base using a vacuum pump;
    after the decrease of the partial pressure of the oxidation agent in the ambient gas to 10 Pa or less, exchanging an inert gas atmosphere in an interior of the reaction tube by supplying inert gas into the reaction tube;
    after the exchange of the inert gas atmosphere in the interior of the reaction tube, lowering a temperature of the to-be-processed base by dropping the to-be-processed base into a liquid bath in which liquid is poured to lower the temperature of the to-be-processed base; and
    after the temperature of the to-be-processed base lowers to 800 degrees C. or less by lowering the temperature, taking the to-be-processed base having the silicon dioxide film out of the reaction tube into atmospheric air.

2. The method of claim 1, wherein the exchange of the ambient gas is performed at a temperature of 1250 degrees C. or more.

3. The method of claim 1, further comprising:
    a POA process between the formation of the silicon dioxide film and the exchange of the ambient gas.

4. The method of claim 3, wherein the POA process comprises supplying gas containing at least any one of hydrogen, water vapor, nitric oxide, dinitrogen monoxide and ammonia to the surface of the to-be-processed base.

5. The method of claim 3, wherein the exchange of the ambient gas is performed at the same temperature as that of the POA process.

6. The method of claim 1, wherein the oxidation agent used in the formation of the silicon dioxide film contains at least any one of oxygen, water vapor, nitric oxide and dinitrogen monoxide.

7. The method of claim 1, wherein the inert gas contains at least any one of argon, helium and nitrogen.

8. The method of claim 1, wherein decreasing the partial pressure of the oxidation agent in the ambient gas to 10 Pa or less decreases a carbon-derived defect plane density segregating at an interface between the to-be-processed base made by SiC and the silicon dioxide film to $2\times10^{12}$ cm$^{-2}$ or less.

9. A method for manufacturing a semiconductor device, comprising:
    thermally-oxidizing a surface of a to-be-processed base made by silicon carbide as body material to form a silicon dioxide film by supplying gas containing oxidation agent to the surface of the to-be-processed base; and
    after the formation of the silicon dioxide film, dropping the to-be-processed base into a liquid bath in which liquid is poured to lower a temperature of the to-be-processed base to a temperature at which the oxidation of the surface of the to-be-processed base is stopped within 2 seconds from the completion of the formation of the silicon dioxide film.

10. The method of claim 9, wherein a thickness of the silicon dioxide film increases by 0.1 nm or less while lowering the temperature of the to-be-processed base.

11. A method for manufacturing a semiconductor device, comprising:
    thermally-oxidizing a surface of a to-be-processed base made by silicon carbide as body material to form a silicon dioxide film by supplying gas containing oxidation agent to the surface of the to-be-processed base; and
    after the formation of the silicon dioxide film, lowering a temperature of the to-be-processed base by dropping the to-be-processed base into a liquid bath in which liquid is poured to lower the temperature of the to-be-processed base.

12. The method of claim 11, wherein the oxidation of the surface of the to-be-processed base stops within 2 seconds from the completion of the formation of the silicon dioxide film.

13. The method of claim 11, wherein a thickness of the silicon dioxide film increases 0.1 nm or less while lowering the temperature of the to-be-processed base.

* * * * *